(12) United States Patent
Kurimoto et al.

(10) Patent No.: US 7,023,208 B2
(45) Date of Patent: Apr. 4, 2006

(54) METHOD OF OPTIMIZING NMR MEASUREMENT CONDITION

(75) Inventors: Tomomitsu Kurimoto, Tokyo (JP); Nobuaki Nemoto, Kanagawa (JP); Katsuo Asakura, Tokyo (JP); Chiharu Yamasaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 33 days.

(21) Appl. No.: 10/834,392

(22) Filed: Apr. 28, 2004

(65) Prior Publication Data
US 2004/0263164 A1 Dec. 30, 2004

(30) Foreign Application Priority Data
Apr. 28, 2003 (JP) ............................ 2003-124272

(51) Int. Cl.
*G01V 3/00* (2006.01)

(52) U.S. Cl. ...................................... 324/314; 324/307

(58) Field of Classification Search ................ 324/314, 324/307, 306, 300
See application file for complete search history.

(56) References Cited

U.S. PATENT DOCUMENTS

| 5,001,428 A | 3/1991 | Maier et al. | |
|---|---|---|---|
| 5,675,253 A * | 10/1997 | Smith et al. | 324/306 |
| 5,994,902 A * | 11/1999 | Xiang et al. | 324/307 |
| 6,396,270 B1 * | 5/2002 | Smith | 324/309 |

* cited by examiner

*Primary Examiner*—Louis Arana
(74) *Attorney, Agent, or Firm*—The Webb Law Firm

(57) ABSTRACT

There is disclosed a method of finding a reliable optimum value of a measurement condition in an NMR measurement. This method starts with gaining NMR measurement data while varying the value of the measurement condition to be optimized. Then, a certain property is extracted as a numerical value from the measurement data. A plot is made of the measurement data versus the value of the measurement condition to create a curve. A model equation coincident with the measurement condition, its range, and the certain property extracted as a numerical value is established. Curve fitting is done in which constants of the model equation are varied such that the equation agrees the created curve. The constant values of the model equation and their standard deviation are obtained by curve fitting. An optimum value of the measurement condition is obtained from the results.

7 Claims, 37 Drawing Sheets

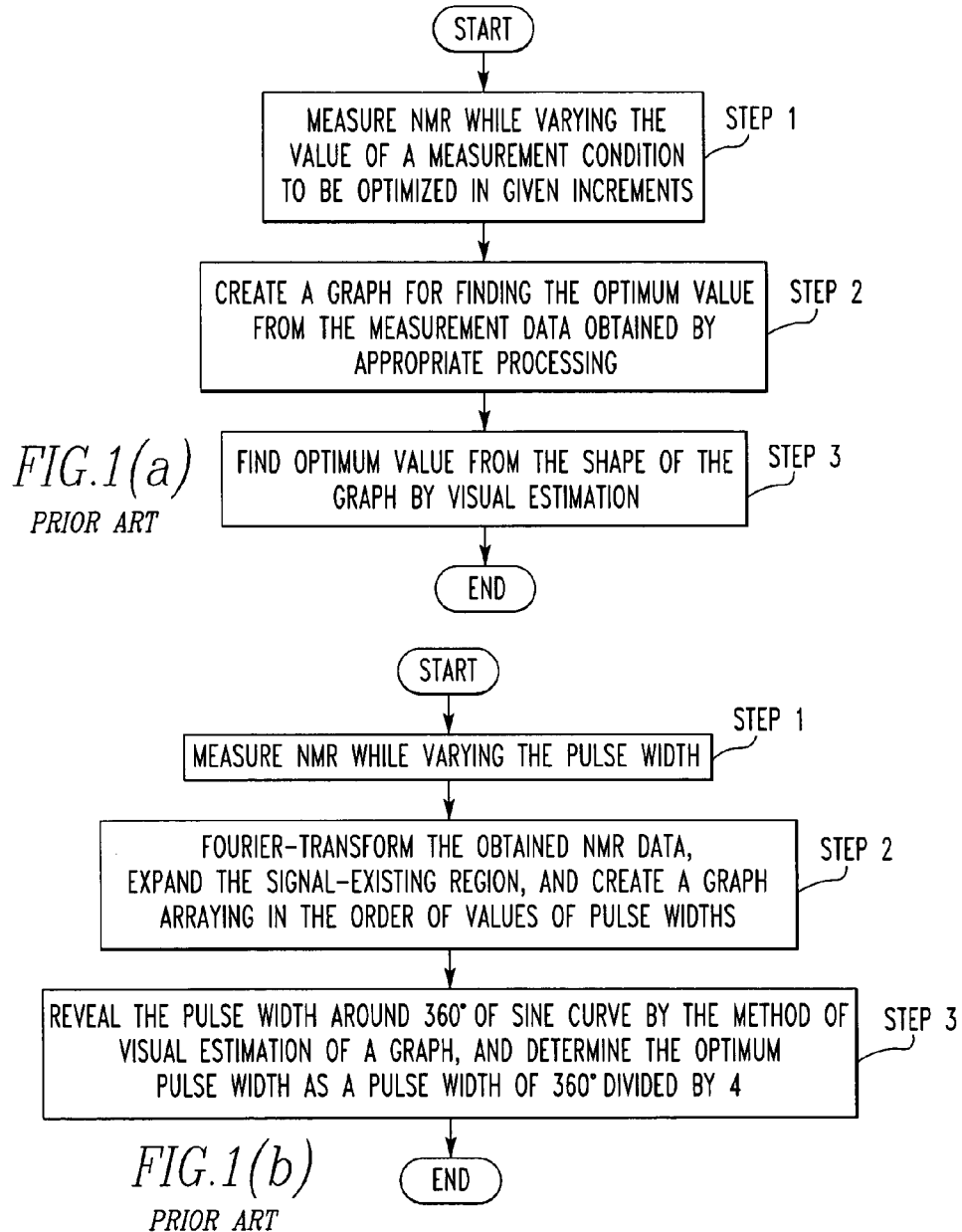
FIG.1(a) PRIOR ART
FIG.1(b) PRIOR ART
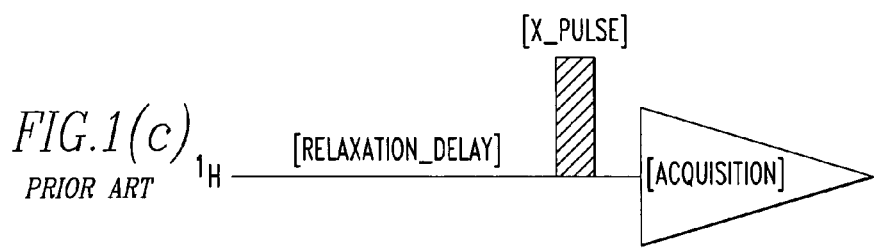
FIG.1(c) PRIOR ART

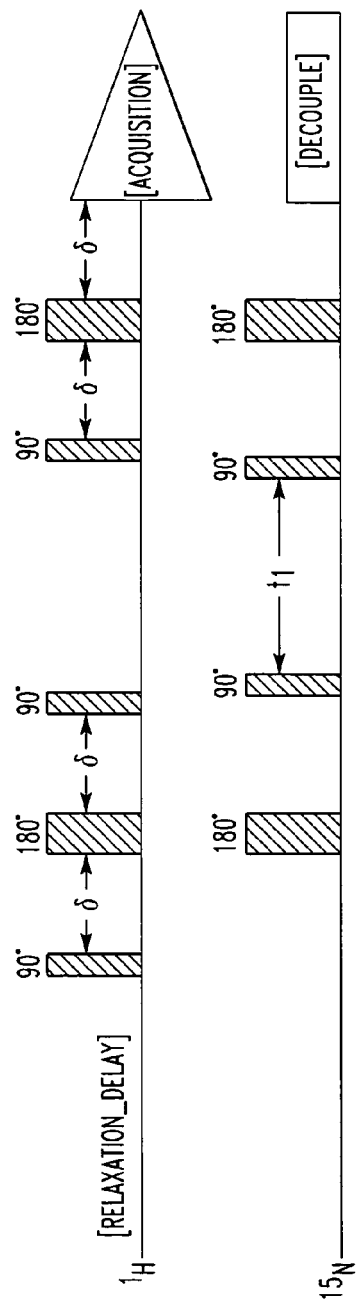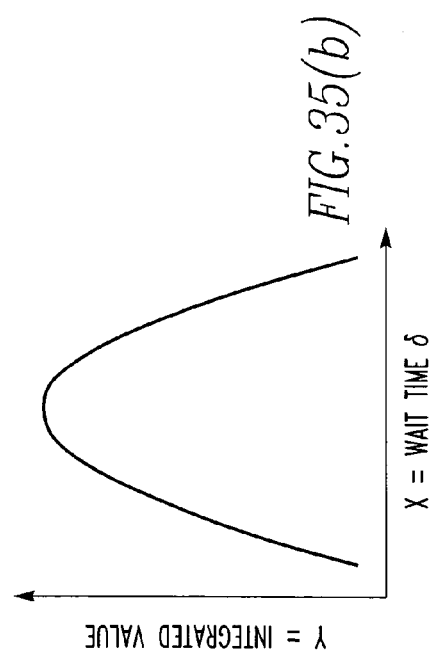
FIG.35(a)
FIG.35(b)

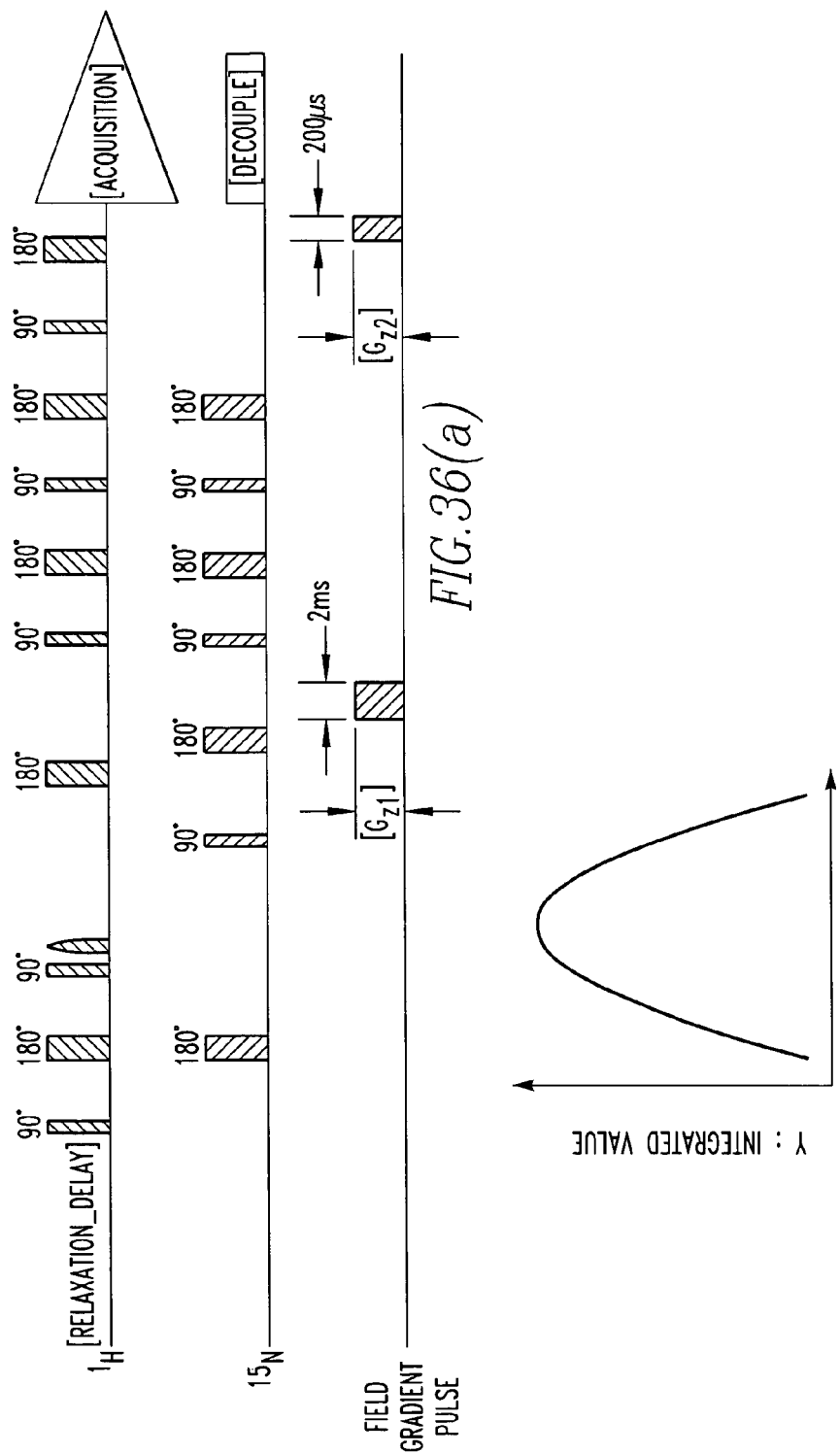

METHOD OF OPTIMIZING NMR MEASUREMENT CONDITION

BACKGROUND OF THE INVENTION

1. Field of the Invention

The present invention relates to a method of optimizing a measurement condition in an NMR measurement.

2. Description of Related Art

FIGS. 1(a) and 1(b) illustrate the prior art method of optimizing an NMR measurement condition. FIG. 1(a) is a flowchart illustrating a general procedure for finding an optimum value of a measurement condition. FIG. 1(b) is a flowchart illustrating a procedure for finding optimum values of RF pulse widths. FIG. 1(c) is a diagram illustrating a pulse sequence for measurement of an RF pulse width.

The general procedure for finding an optimum value of a measurement condition is described by referring to FIG. 1(a). In step 1, NMR measurements are carried out while varying the value of a measurement condition to be optimized in given increments. In step 2, a graph for finding the optimum value from the obtained measurement data by appropriate processing is created. At this time, the varying value of the measurement condition is plotted on one axis of the graph. In step 3, the optimum value is found from the shape of the graph by visual estimation.

As a specific example, a procedure for finding an optimum value of an RF pulse width as a measurement condition is next described by referring to FIGS. 1(b) and 1(c). In step 1, NMR measurements are performed while varying the pulse width from 0 to 70 is using a pulse sequence shown in FIG. 1(c), for example, under measurement conditions listed in Table 1.

TABLE 1

Measurement condition set 1 under which measurements are performed with varying RF pulse width

| Item | Value |
|---|---|
| Sample | 15 mM copper dichloride/1% $H_2O$, 99% $D_2O$ |
| Magnetic field intensity | 14.09636928 T |
| Observed nucleus | $^1H$ |
| Observe frequency | 600.1723046 MHz |
| Center frequency of observation | about 4.7 ppm (resonance frequency of water) |
| Number of data points | 16384 |
| Sweep width | 9.00252071 kHz |
| Number of accumulations | 1 |
| $B_1$ pulse intensity | about 25 kHz |
| Observation time | 1.81993472 s |
| Relaxation_delay | 1 s |
| Temperature | 25° C. |

In the pulse sequence of FIG. 1(c), "[relaxation_delay]" indicates the wait time of each repetition pulse. In this example, the time is 1 s.

"[x_pulse]" indicates an RF pulse. In this example, NMR measurements are performed using a pulse width varied from 0 to 70 µs.

"[acquisition]" indicates an observation. In this example, the time necessary for an observation is 1.81993472 s as shown in Table 1.

Data obtained from a measurement is shown in FIG. 2, where one-dimensional (1D) NMR data obtained using a certain pulse width are arrayed in the order of values of pulse widths at intervals of 2 µs.

In step 2, the obtained NMR data are first Fourier-transformed. The resulting data are shown in FIG. 3, where the data are arrayed in the order of values of pulse widths at intervals of 2 µs in the same way as in FIG. 2. Then, with respect to each set of 1D NMR data, a range from 4 to 5.5 ppm in the signal region is displayed. The data are arrayed horizontally in the order of values of pulse widths. The obtained graph is shown in FIG. 4, where the horizontal axis indicates the pulse width, while the vertical axis indicates the intensity of the NMR spectrum.

In step 3, a waveform formed by connecting the vertices of spectral intensities of FIG. 4 by means of straight lines is regarded as a sinusoidal (SIN) wave. Visual estimation of a pulse width of 360° reveals that it is about 28 µs. Since it has been already known that the optimum pulse width is 90°, the optimum pulse width is equal to the pulse width of 360° divided by 4, i.e., 28 µs/4=7 µs.

An NMR instrument designed to quantitatively indicate the nonuniformities in transmit and receive magnetic fields is shown in Japanese Patent Laid-Open No. H3-139330. In particular, NMR scans are made with RF exciting field intensities of different arrays. A curve is applied to each set of corresponding data elements in one set of intensity arrays. The peaks of the applied curves are determined. Corresponding data in the transmit and receive arrays are generated from the determined peaks. Thus, a magnetic field map indicating nonuniformities in an RF magnetic field by means of the magnitudes of data elements is created.

However, the prior art method of finding the optimum RF pulse width has the problem that the reliability of the optimum value is low because the value is found from a created graph by visual estimation. In order to obtain an optimum value with high reliability, it is necessary to increase the number of measurement data items. This prolongs the measurement time. If the number of measurement data items is reduced to shorten the measurement time, the reliability of the obtained optimum value deteriorates.

Furthermore, Japanese Patent Laid-Open No. H3-139330 does not disclose a technique for optimizing measurement conditions, though the reference discloses a technique quantitatively indicating nonuniformities in transmit and receive fields.

SUMMARY OF THE INVENTION

It is an object of the present invention to provide a technique for finding a reliable optimum value of a measurement condition with a reduced number of measurement data items, i.e., in a short time.

A method of optimizing an NMR measurement condition in accordance with the present invention starts with gaining NMR measurement data while varying the value of the measurement condition to be optimized. Then, a certain property is extracted as a numerical value from the measurement data. A plot is made along the varied value of the measurement condition to create a curve. A model equation coincident with the measurement condition, its range, and the certain property extracted as a numerical value is established. Curve fitting in which constants of the model equation are varied is done such that the equation agrees with the created curve. Constant values of the model equation and their standard deviation are obtained by curve fitting. An optimum value of the measurement condition is obtained from the results.

In the present invention, curve fitting is used and so a good result can be obtained if the number of data items is reduced as long as they characterize a waveform. A reliable optimum value of a measurement condition can be found in a short time.

Other objects and features of the invention will appear in the course of the description thereof, which follows.

BRIEF DESCRIPTION OF THE DRAWINGS

FIGS. 1(a), 1(b), and 1(c) are flowcharts and a diagram illustrating the prior art method of optimizing an NMR measurement condition;

FIGS. 35(a) and 35(b) illustrate a second specific example of Embodiment 11; and FIGS. 36(a) and 36(b) are diagrams illustrating a third specific example of Embodiment 11.

DESCRIPTION OF THE PREFERRED EMBODIMENTS

The preferred embodiments of the present invention are hereinafter described. Of the following embodiments, Embodiments 1–5 pertain to a method of finding an optimum value of an RF pulse width using integrated values in the signal region. Embodiments 6–10 pertain to a method of finding an optimum value of an RF pulse width using peak top intensities of a signal. In the following description, the measurement conditions of Table 1 and the pulse sequence of FIG. 1(c) are used. Of course, the invention is not restricted to the measurement conditions of Table 1 and pulse sequence of FIG. 1(c). Embodiment 11 pertains to a general method of optimizing an NMR measurement condition. In the following description, the unit name "abn" in the various tables is identical with the unit name "au" and means a unitless intensity or magnitude.

Figure 5A:
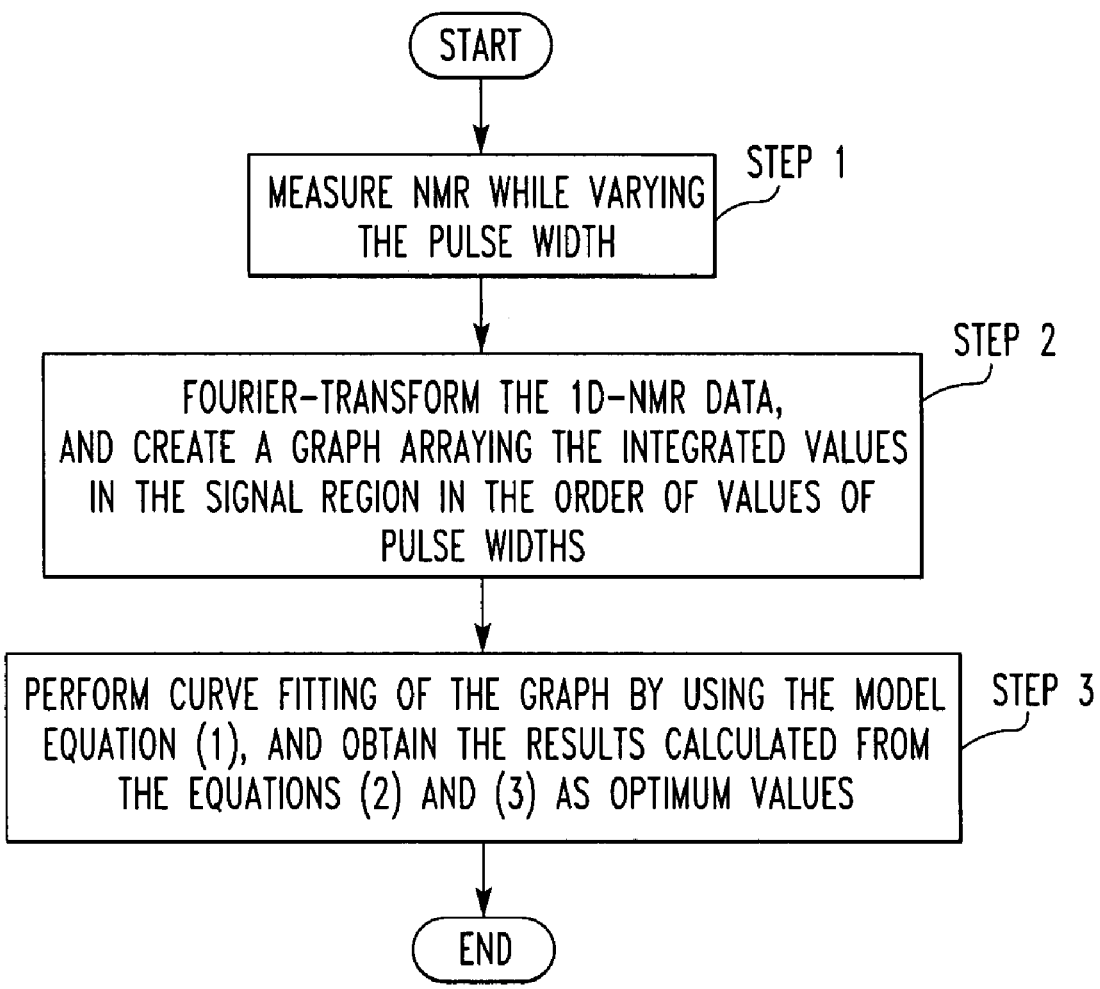
FIG. 5 is a flowchart illustrating Embodiment 1 of the present invention.
Figure 5B:
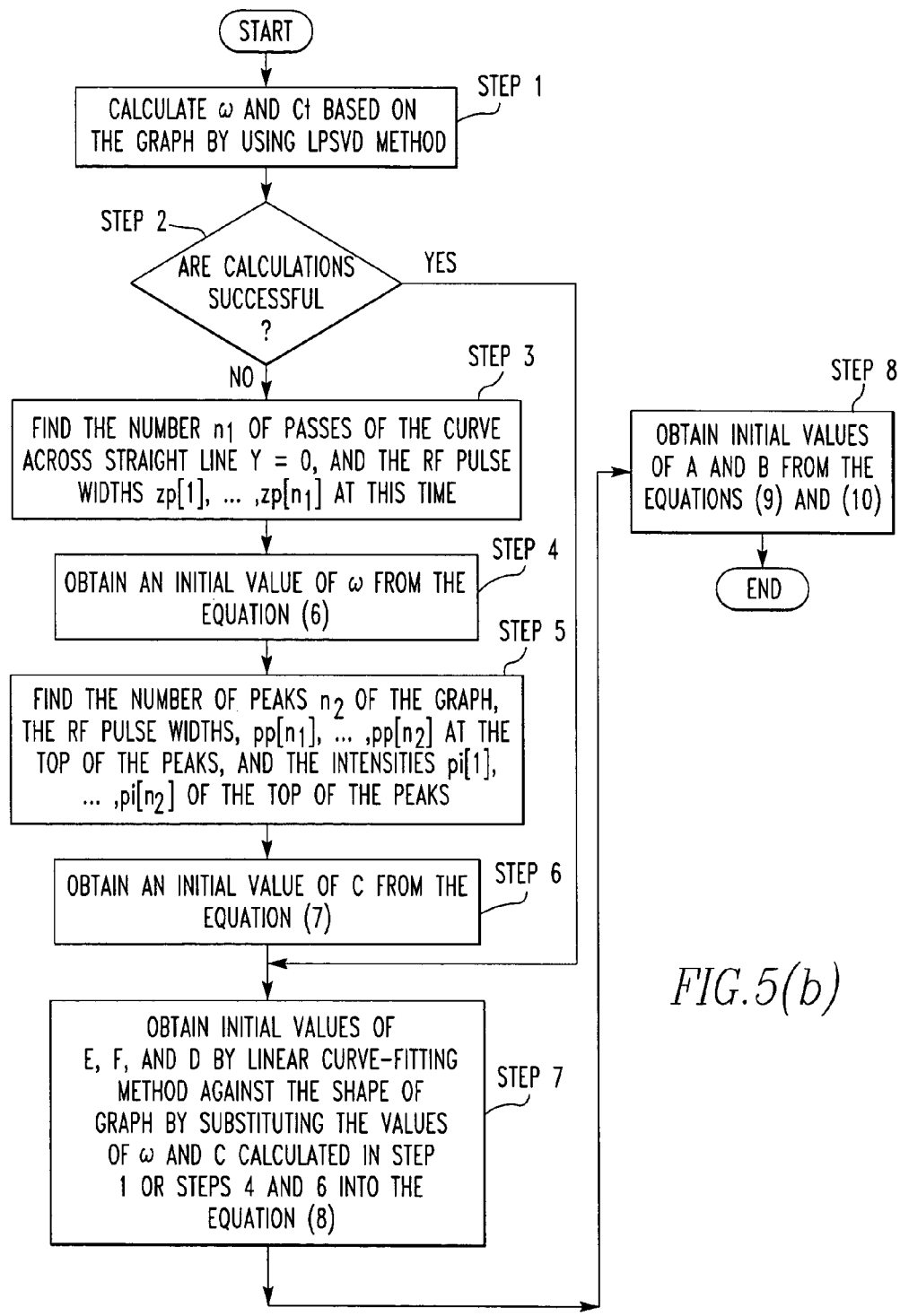

FIGS. 5(a) and 5(b) are flowcharts illustrating Embodiment 1 of the present invention. FIG. 5(a) illustrates a procedure for finding an optimum value of an RF pulse width. FIG. 5(b) illustrates a procedure for finding an initial value in a DFP method (described later). Embodiment 1 is a method of finding an optimum RF pulse width by measuring the pulse width over the whole range.

Figure 2:
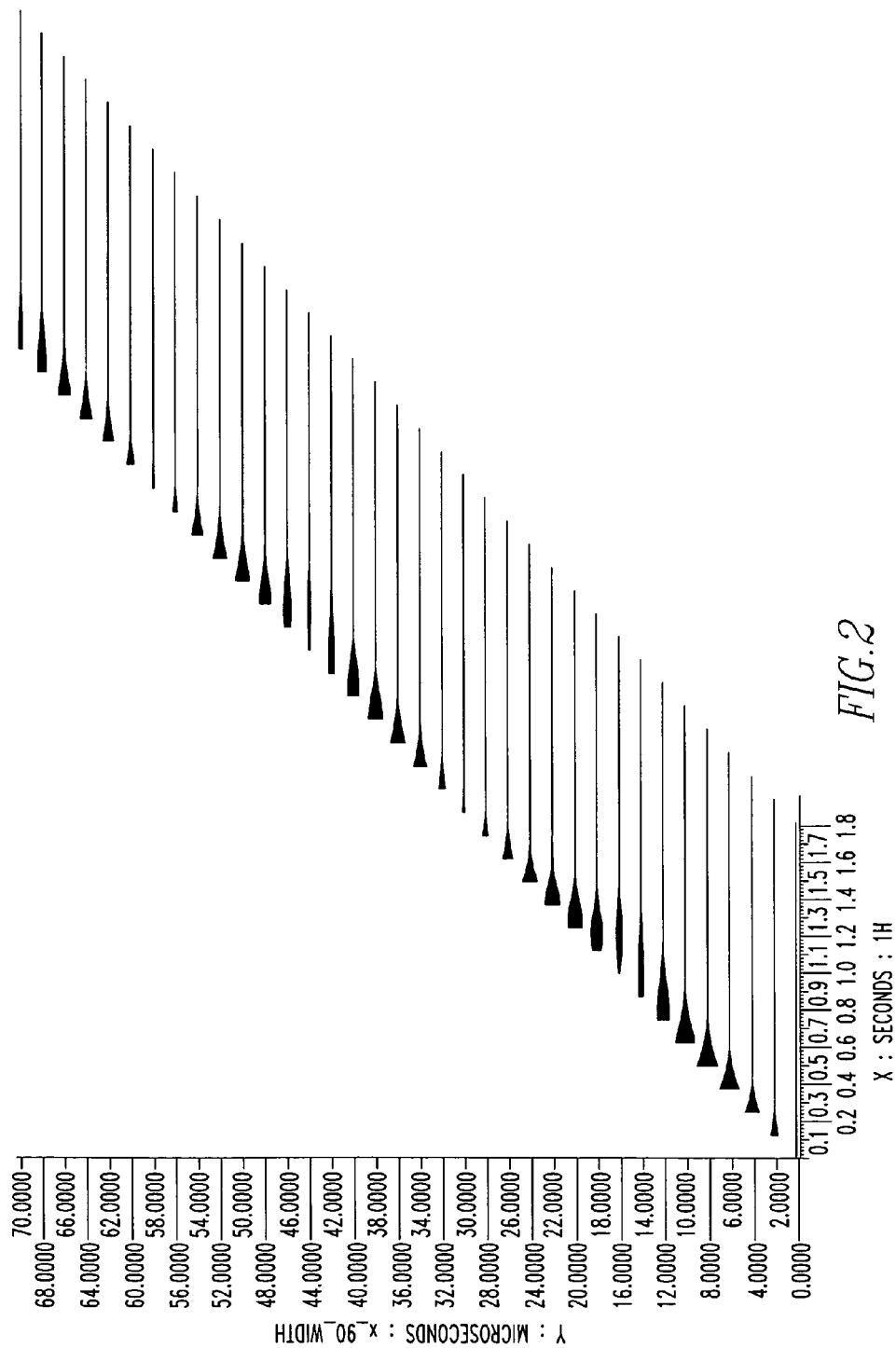
FIG. 2 is a graph of one-dimensional(1D) NMR data obtained by the method illustrated in FIGS. 1(a), 1(b), and 1(c)

In FIG. 5(a), in step 1, NMR measurements are performed while varying an RF pulse width from 0 to 70 μs in increments of 2 μs, using the measurement conditions shown in Table 1 and pulse sequence shown in FIG. 1(c), for example. As a result, measurement data shown in FIG. 2 are obtained.

Figure 3:
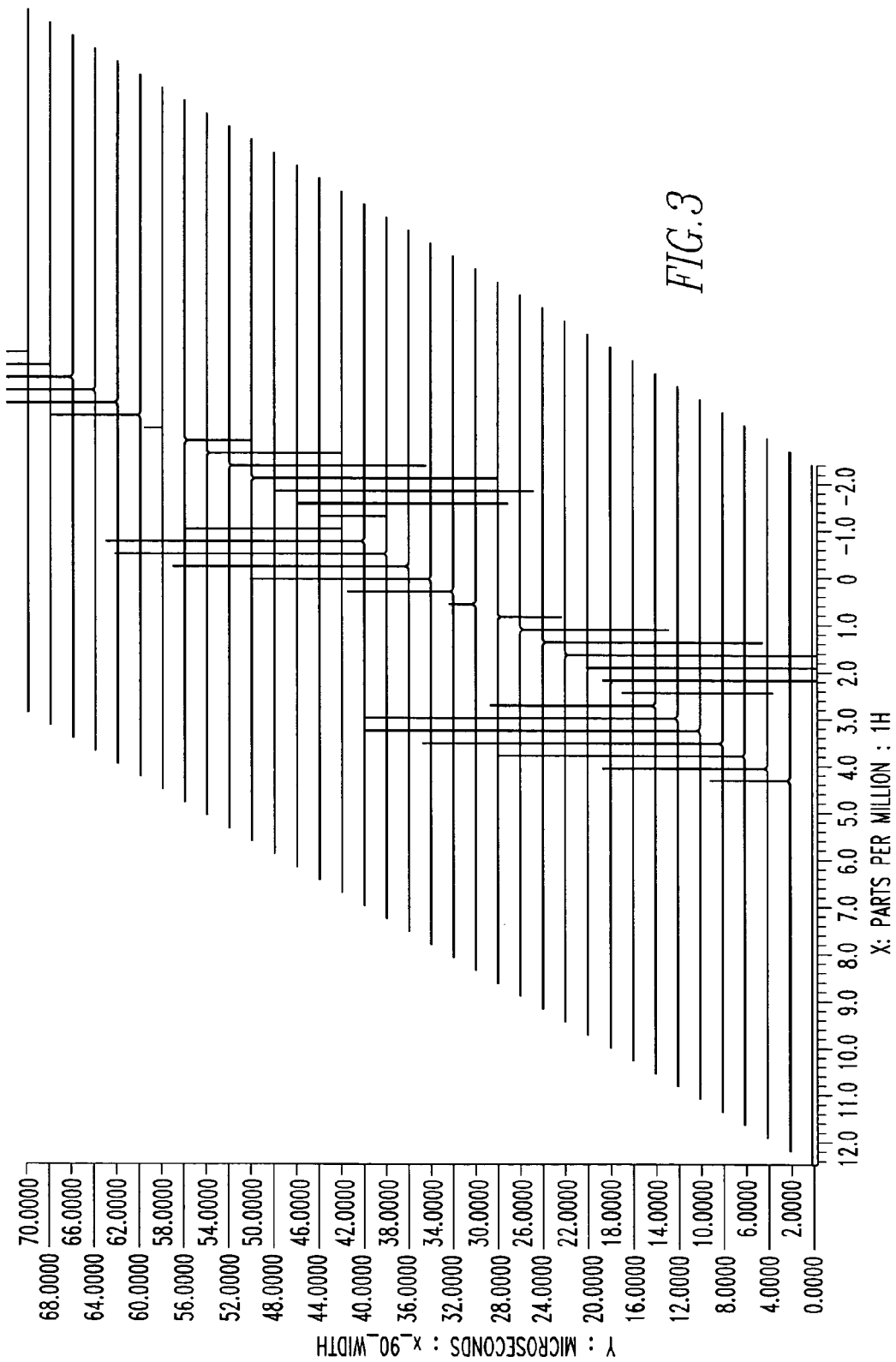
FIG. 3 is a graph illustrating data obtained by Fourier-transforming the 1D NMR data shown in FIG. 2.
Figure 4:
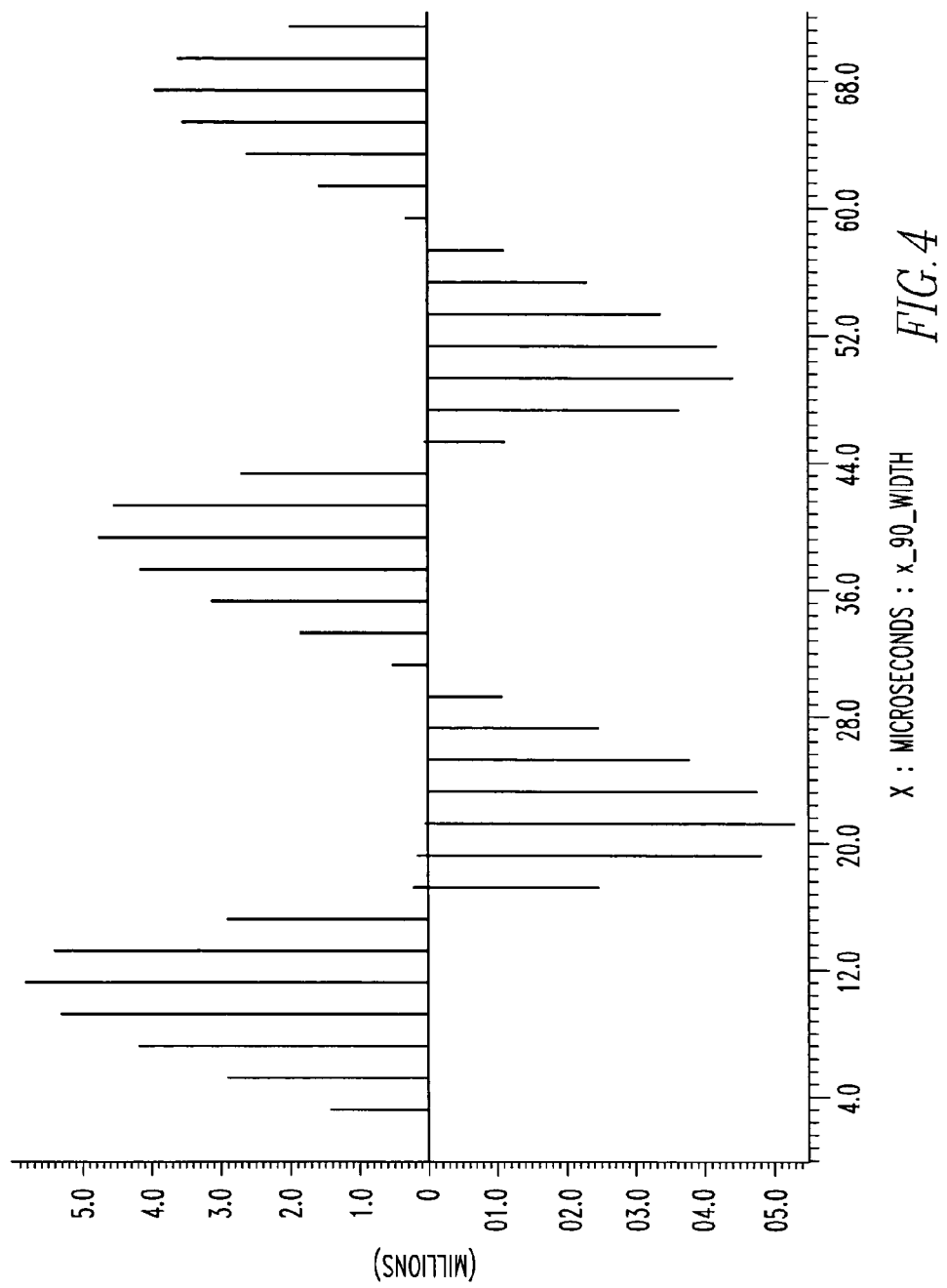
FIG. 4 is a graph consisting of pulses having different widths and obtained from the 1 D NMR data shown in FIG. 2, and in which the pulse widths are arrayed in the order of their values in a range from 4 to 5.5 ppm.

In step 2, the measurement data are Fourier-transformed and a plot is done along the values of the RF pulse width using integrated values in the signal region. In this way, a curve is created. This processing results in data as shown in FIG. 3. Finding the integrated values from a signal range from 4 to 5.5 ppm produces results listed in Table 2. Plotting the results gives rise to the curve indicated by the solid line in FIG. 6.

TABLE 2

Results 1 of calculations of integrated values

| Index | x_90_width | Intensity |
|---|---|---|
| 1 | 0 μs | −3.9417 kabn |
| 2 | 2 μs | 50.35382 Mabn |

TABLE 2-continued

Results 1 of calculations of integrated values

| Index | x_90_width | Intensity |
|---|---|---|
| 3 | 4 μs | 96.74335 Mabn |
| 4 | 6 μs | 126.74086 Mabn |
| 5 | 8 μs | 134.78419 Mabn |
| 6 | 10 μs | 119.99778 Mabn |
| 7 | 12 μs | 84.80437 Mabn |
| 8 | 14 μs | 37.11067 Mabn |
| 9 | 16 μs | −14.37721 Mabn |
| 10 | 18 μs | −60.44845 Mabn |
| 11 | 20 μs | −93.60701 Mabn |
| 12 | 22 μs | −106.62882 Mabn |
| 13 | 24 μs | −98.13594 Mabn |
| 14 | 26 μs | −70.18078 Mabn |
| 15 | 28 μs | −28.46294 Mabn |
| 16 | 30 μs | 18.92854 Mabn |
| 17 | 32 μs | 61.74452 Mabn |
| 18 | 34 μs | 93.01865 Mabn |
| 19 | 36 μs | 105.83569 Mabn |
| 20 | 38 μs | 98.68427 Mabn |
| 21 | 40 μs | 72.78549 Mabn |
| 22 | 42 μs | 34.93452 Mabn |
| 23 | 44 μs | −7.80636 Mabn |
| 24 | 46 μs | −45.95444 Mabn |
| 25 | 48 μs | −76.29246 Mabn |
| 26 | 50 μs | −90.08089 Mabn |
| 27 | 52 μs | −84.6685 Mabn |
| 28 | 54 μs | −62.78815 Mabn |
| 29 | 56 μs | −28.93477 Mabn |
| 30 | 58 μs | 10.14414 Mabn |
| 31 | 60 μs | 47.04411 Mabn |
| 32 | 62 μs | 73.08897 Mabn |
| 33 | 64 μs | 85.13906 Mabn |
| 34 | 66 μs | 80.43171 Mabn |
| 35 | 68 μs | 60.11846 Mabn |
| 36 | 70 μs | 29.17292 Mabn |

In step 3, cure fitting described later) is performed in which the constants A, B, C, D, and ω of model equation (1) (given later) are varied such that model equation (1) agrees with the curve indicated by the solid line in FIG. 6. Model equations (1) (Eq. (1)), Eq. (2) for finding a 360° RF pulse width, and Eq. (3) for finding a 90° RF pulse width are given below.

$$y = A\sin(\omega x + B)\exp\left(-\frac{t}{C}\right) + D \quad (1)$$

$$PW360 = \frac{2\pi}{\omega} \quad (2)$$

$$PW90 = \frac{PW360}{4} \quad (3)$$

where t is the RF pulse width, A, B, C, D, and ω are constants, and y is the theoretical value of the intensity at t.

Curve fitting using model equation (1) produces the results shown in Table 3.

TABLE 3

Results 1 of calculations of curve fitting

| Constant | Value |
|---|---|
| A | 120149.01181 kabn |
| B | 0 rad |
| C | 207.85512 μs |
| D | 5381.92103 kabn |

TABLE 3-continued

Results 1 of calculations of curve fitting

| Constant | Value |
|---|---|
| ω | 0.21696 rad/μs |
| σ | 9792.45099 kabn |

Figure 6:
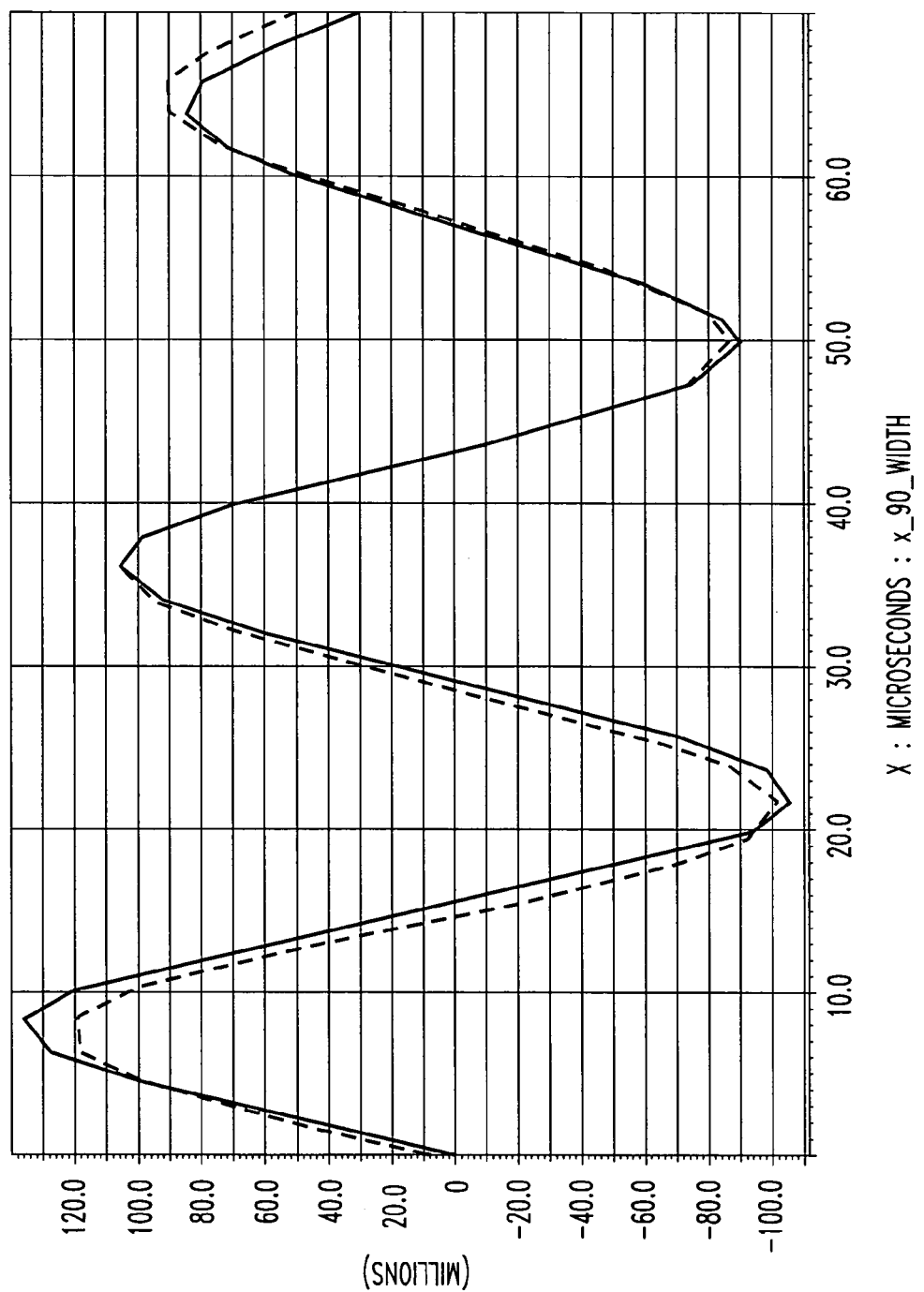
FIG. 6 is a graph of curves obtained by plotting the integrated values in a given signal region.

Plotting of the values of Table 3 using model equation (1) produces the curve indicated by the broken line in FIG. 6, thus obtaining the constant values A, B, C, D, and ω and their standard deviation σ. Substituting the results into Eq. (2) gives rises to 360° pulse width (PW360)=28.96043 μs. This is substituted into Eq. (3), resulting in PW90=7.24011 μs that is an optimum RF pulse width. The standard deviation σ in Table 3 gives an index of the reliability of the obtained RF pulse width.

Curve fitting is to find the A, B, C, D, and ω which minimize the following evaluation formula (4) using a multi-dimensional variable metric method (Davidon-Fletcher-Powell (DFP) method) described in "Numerical Recipes in C: THE ART OF SCIENTIFIC COMPUTING", Second Edition (ISEN 0-521-43108-5), 1992, pp. 425–430. The DFP method needs an evaluation equation and initial values. Eq. (4) using Eq. (5) identical with Eq. (1) is employed as this evaluation formula.

$$DIFF = \sum_{i=PWstart}^{PWend} \{g(t) - f(t)\}^2 \quad (4)$$

$$f(t) = A\sin(\omega x + B)\exp\left(-\frac{t}{C}\right) + D \quad (5)$$

In Eq. (4), t is an RF pulse width, PWstart is the start value of the RF pulse width, PWend is the end value of the width, and g(t) is the actually measured value of the intensity at the RF pulse width of t. The theoretical value f(t) of intensity is defined by Eq. (5) and equal to the right side of Eq. (1).

A method of finding the initial values used in the DFP method is next described with reference to FIG. 5(b). In step 1, the initial values of ω and C of model equation (1) are computed using the LPSVD (Linear Prediction Singular Value Deconvolution) method that indicates a method of finding the initial values in the *Journal of Magnetic Resonance*, 61, 1985, pp. 465–481. If calculations using the LPSVD method are successful, initial values ω=0.21703 rad/μs and C=231.59569 μs are obtained.

In step 2, if calculations using the LPSVD method are unsuccessful, the program goes to step 3. If the calculations are successful, the program goes to step 7.

In step 3, the number $n_1$ of passes of the curve indicated by the solid line in FIG. 6 across straight line y=0 and the RF pulse widths zp[1], . . . , zp[$n_1$] at this time are found. The results are shown in Table 4.

TABLE 4

Intersection 1 with y = 0

| Item | Value |
|---|---|
| $n_1$ | 5 |
| zp[1] | 0.00016 μs |
| zp[2] | 15.44153 μs |
| zp[3] | 29.20118 μs |

TABLE 4-continued

Intersection 1 with y = 0

| Item | Value |
|---|---|
| zp[4] | 43.63471 µs |
| zp[5] | 57.48084 µs |

In step 4, the results shown in Table 4 are substituted into Eq. (6). As an initial value of ω, we obtain ω=0.21862 rad/µs.

$$\omega = \frac{\pi \times (n_1 - 1)}{zp[n_1] - zp[1]} \quad (6)$$

In step 5, the number of positive-going (upward) peaks $n_2$ of the curve indicated by the solid line in FIG. 6, the RF pulse widths pp[1], . . . , pp[$n_2$] at the tops of the peaks, and the intensities pi[1], . . . , pi[$n_2$] of the tops of the peaks are found. The results are listed in Table 5.

TABLE 5

Tops 1 of peaks

| Item | Value |
|---|---|
| $n_2$ | 3 |
| pp[1] | 8 µs |
| pp[2] | 36 µs |
| pp[3] | 64 µs |
| pi[1] | 134.78419 kabn |
| pi[2] | 105.83569 kabn |
| pi[3] | 85.13906 kabn |

In step 6, the results shown in Table 5 are substituted into Eq. (7). We obtain 121.90106 µs as an initial value of C (C=121.90106 µs).

$$C = \frac{pp[n_2] - pp[1]}{\ln\left(\frac{pi[1]}{pi[n_2]}\right)} \quad (7)$$

In step 7, the values of ω and C calculated in step 1 or steps 4 and 6 are substituted into Eq. (8) that is an expansion of Eq. (5). Using each item as a basis function and employing the curve indicated by the solid line in FIG. 6, the linear least squares method shown in "Numerical Recipes in C: THE ART OF SCIENTIFIC COMPUTING", Second Edition (ISEN 0-521-43108-5), 1992, pp. 671–681 is implemented. The results (optimum constant values D, E, and F) listed in Table 6 are obtained. Table 6 uses the results of step 1.

$$y = E\sin(\omega x)\exp\left(-\frac{t}{C}\right) + F\cos(\omega x)\exp\left(-\frac{t}{C}\right) + D \quad (8)$$

$$A = \sqrt{E^2 + F^2} \quad (9)$$

TABLE 6

Results 1 of calculations of linear least squares method

| Item | Value |
|---|---|
| D | 5381.95203 kabn |
| E | 119968.83441 kabn |
| F | −6577.86175999999 kabn |

In step 8, the results shown in Table 6 are substituted into calculation formulas (9), (10-1), and (10-2), resulting in A=120149.03035 kabn and B=0.05477 rad.

$$\cos(B) = \frac{E}{\sqrt{E^2 + F^2}} \quad (10\text{-}1)$$

$$\sin(B) = \frac{F}{\sqrt{E^2 + F^2}} \quad (10\text{-}2)$$

Then, ω and C calculated in step 1 or steps 4 and 6, D calculated in step 7, and A and B calculated in step 8 are used as initial values in the DFP method. These values are varied. The values of A, B, C, D, and ω that minimize the value of evaluation formula (4) are found. Where the initial values of the DFP method are used, if measurement conditions as listed in Table 1 and the pulse sequence shown in FIG. 1(*c*), for example, are used, it is known that B=0 rad. Therefore, the DFP method is so implemented that the constants A, C, D, and ω are varied while the constant B of model equation (1) is kept at 0 rad.

In the present embodiment, the step of obtaining an optimum RF pulse width contains no manual operation and so reproducible results can be obtained. In the above description, the number of data items is set to the number of data items used in the prior art procedure for convenience of illustration. In curve fitting, in a case where there are data points characterizing a waveform, if the number of data points is reduced, similar results can be obtained. Therefore, good results can be obtained if there are a reduced number of data items. This similarly applies to embodiments described later.

Figure 7:
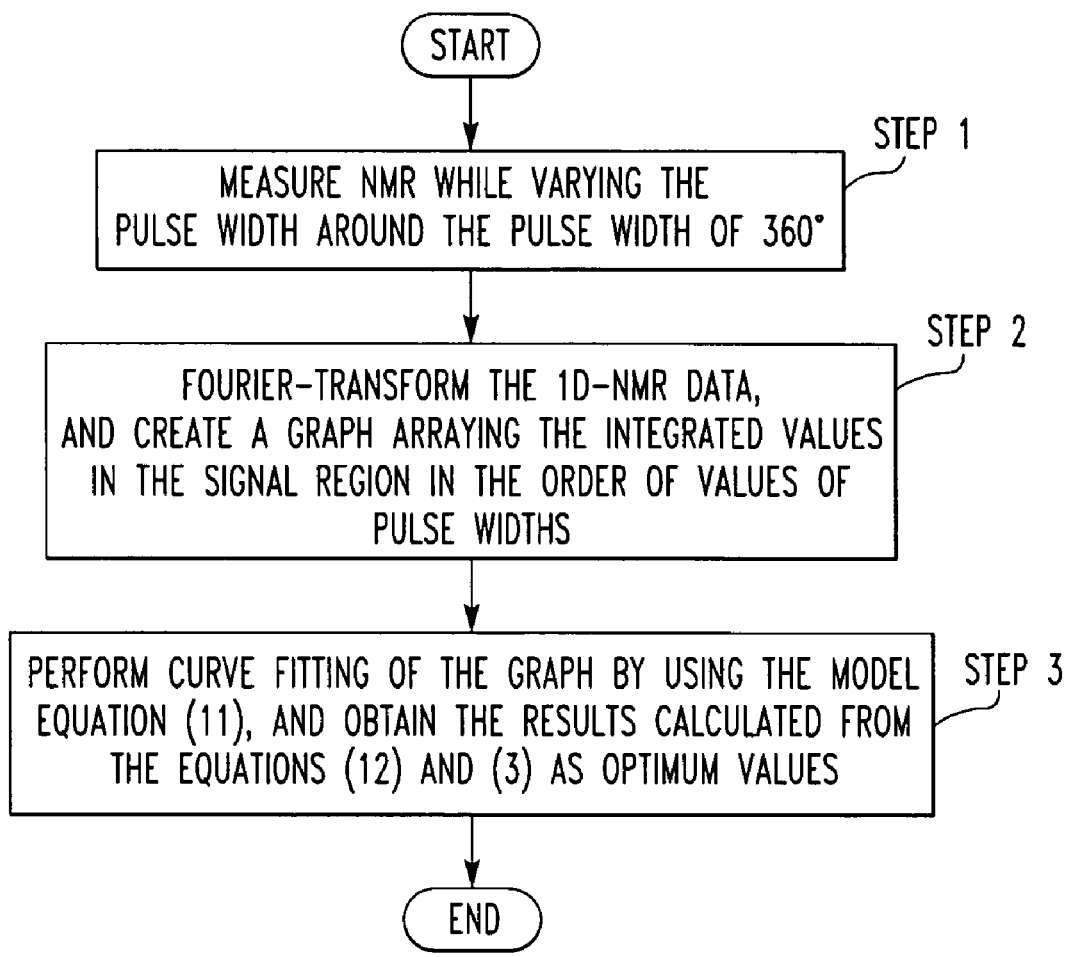
FIG. 7 is a flowchart illustrating Embodiment 2 of the present invention.

Embodiment 2 of the present invention is described next with reference to FIG. 7. Embodiment 2 is a method of finding an optimum RF pulse width by performing NMR measurements while varying the pulse width in the neighborhood of 360° pulse width. In the following description, it is assumed that it is previously known that the 360° pulse width is 28 µs because of the technique described as the prior art or information obtained from another technique.

Figure 8:
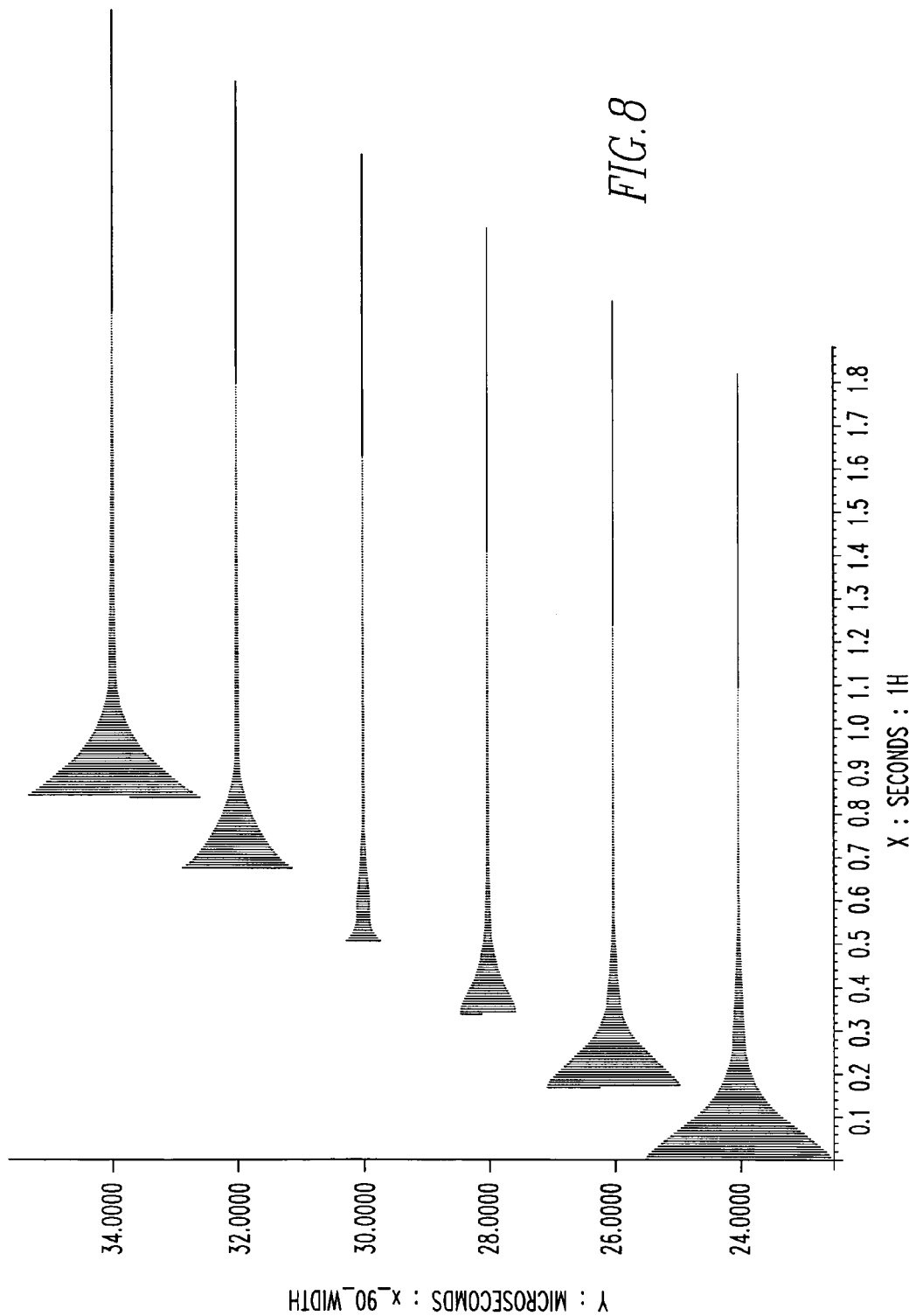
FIG. 8 is a graph showing NMR measurement data close to the 360° pulse width.

In step 1, NMR measurements are performed while varying an RF pulse width from 24 to 34 µs (i.e., around 360° pulse width) in increments of 2 µs, using the measurement conditions shown in Table 1 and pulse sequence shown in FIG. 1(*c*), for example. The measurement data shown in FIG. 8 are obtained.

In step 2, the measurement data are Fourier-transformed, and integrated values in the signal region are plotted along the values of the RF pulse width. In this way, a curve is created. This processing results in data shown in FIG. 9. Finding the integrated values from a signal range from 4 to 5.5 ppm produces results listed in Table 7. Plotting the results gives rise to the curve indicated by the solid line in FIG. 10.

TABLE 7

Results 2 of calculations of integrated values

| Index | x_90_width | Intensity |
|---|---|---|
| 1 | 24 µs | −49.11459 Mabn |
| 2 | 26 µs | −35.15117 Mabn |
| 3 | 28 µs | −14.27532 Mabn |
| 4 | 30 µs | 9.45965 Mabn |
| 5 | 32 µs | 30.95036 Mabn |
| 6 | 34 µs | 46.61799 Mabn |

In step 3, the linear least squares method is implemented using model equation (11). The results shown in Table 8 are obtained. Plotting of the contents of Table 8 using model equation (11) results in the curve indicated by the broken line in FIG. 10.

$$y = At + B \tag{11}$$

TABLE 8

Results 2 of calculations of curve fitting

| Constant | Value |
|---|---|
| A | 10.01003 Mabn/µs |
| B | −292.20986 Mabn |
| σ | 2.68816 Mabn |

Then, the values in Table 8 are substituted into Eq. (12), producing PW360=29.19169 µs as a 360° pulse. This is substituted into Eq. (3), giving rise to an optimum RF pulse width PW90=7.29792 µs. The standard deviation σ in Table 8 gives an index of the reliability of the obtained RF pulse width.

$$PW360 = -\frac{B}{A} \tag{12}$$

In the present embodiment, the step of obtaining the RF pulse width does not use visual estimation. Therefore, reproducible results can be obtained.

Figure 11:
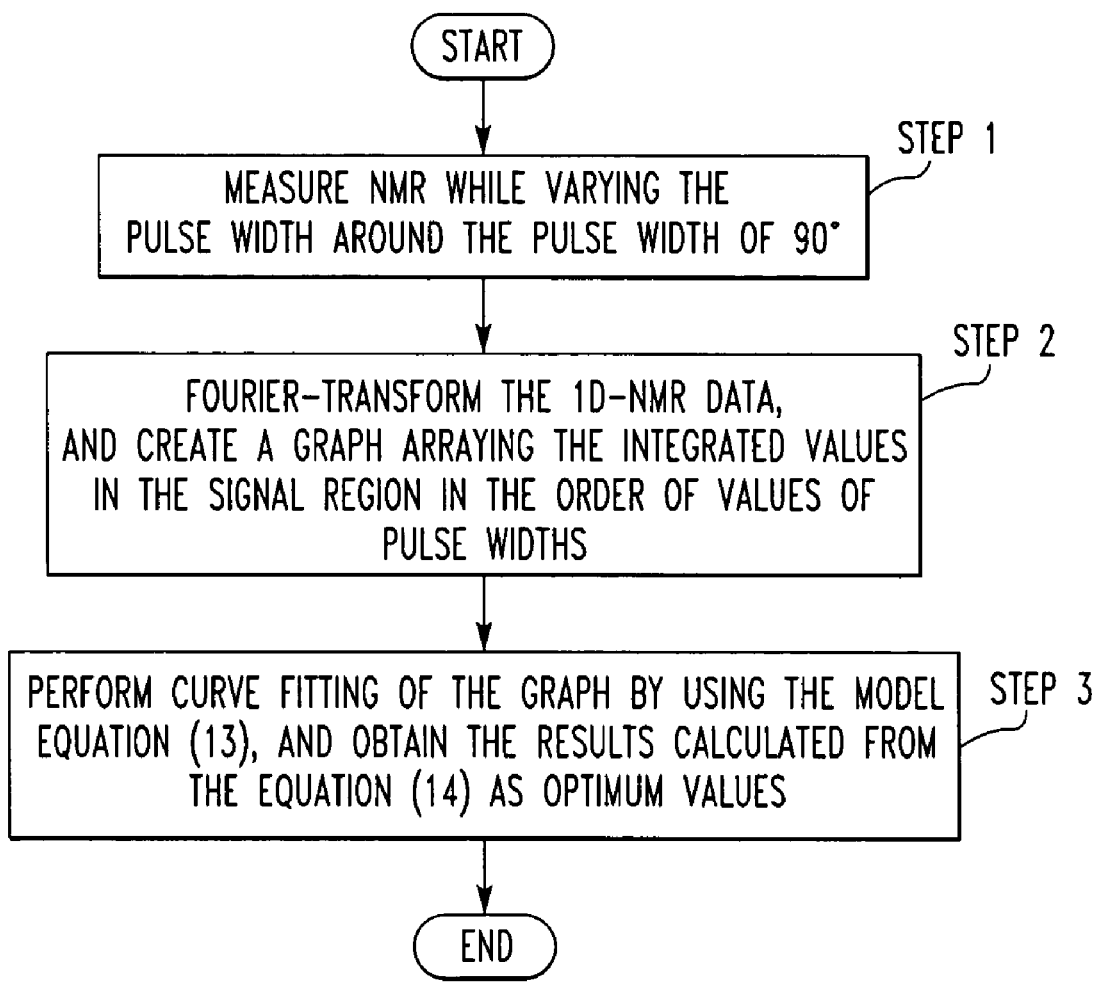
FIG. 11 is a flowchart illustrating Embodiment 3 of the present invention.

Embodiment 3 of the present invention is next described with reference to FIG. 11. Embodiment 3 is a method of finding an optimum RF pulse width by performing NMR measurements while varying the pulse width in the neighborhood of 90° pulse width. In the following description, it is assumed that it is previously known that the 90° pulse width is 7 µs because of the technique described as the prior art or information obtained from another technique.

Figure 12:
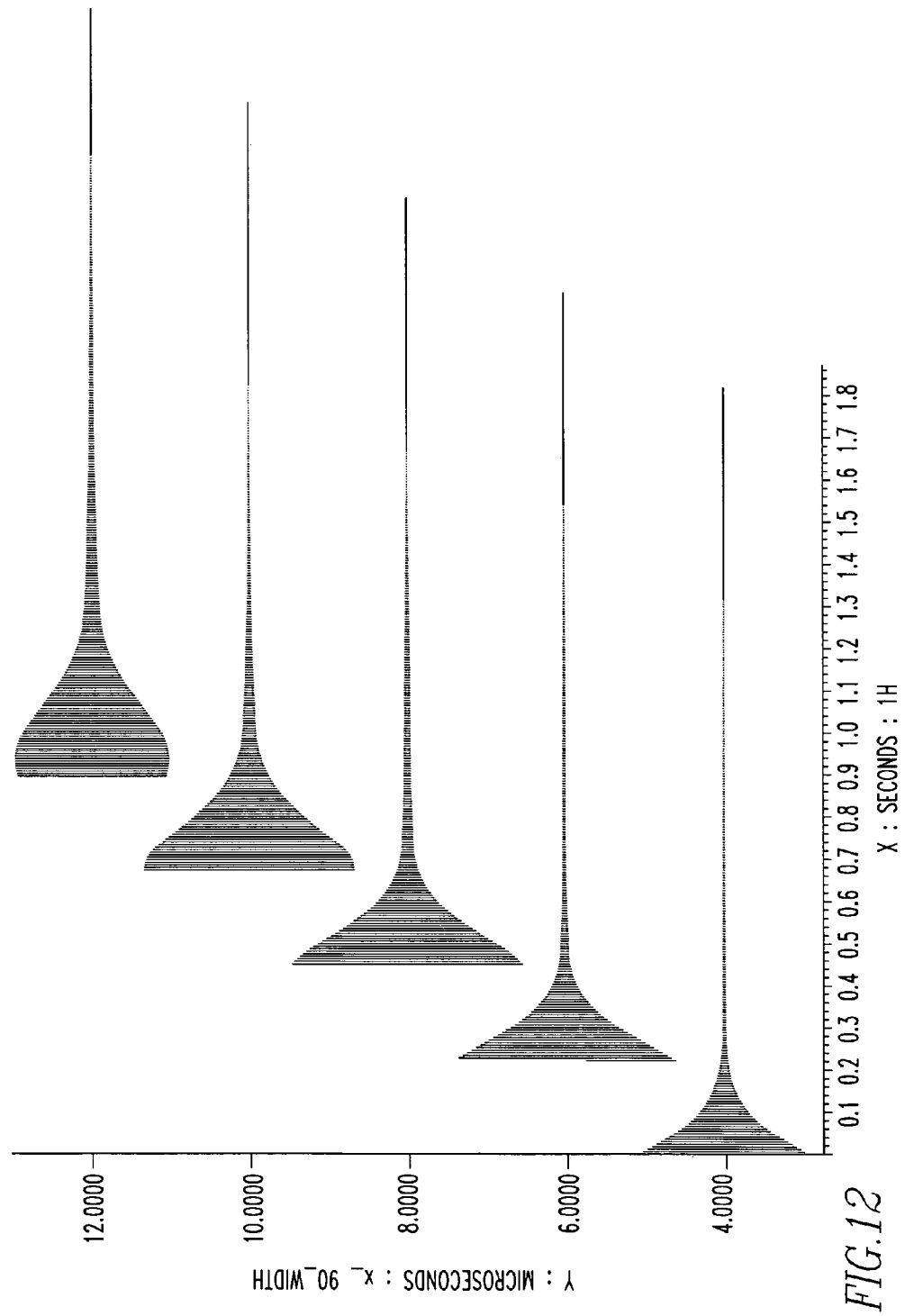
FIG. 12 is a diagram showing data obtained by a measurement in which an RF pulse width was varied.

In step 1, NMR measurements are performed while varying an RF pulse width from 4 to 12 µs (i.e., around 90° pulse width) in increments of 2 µs, using the measurement conditions shown in Table 1 and pulse sequence shown in FIG. 1(c), for example. The measurement data shown in FIG. 12 are obtained.

Figure 13:
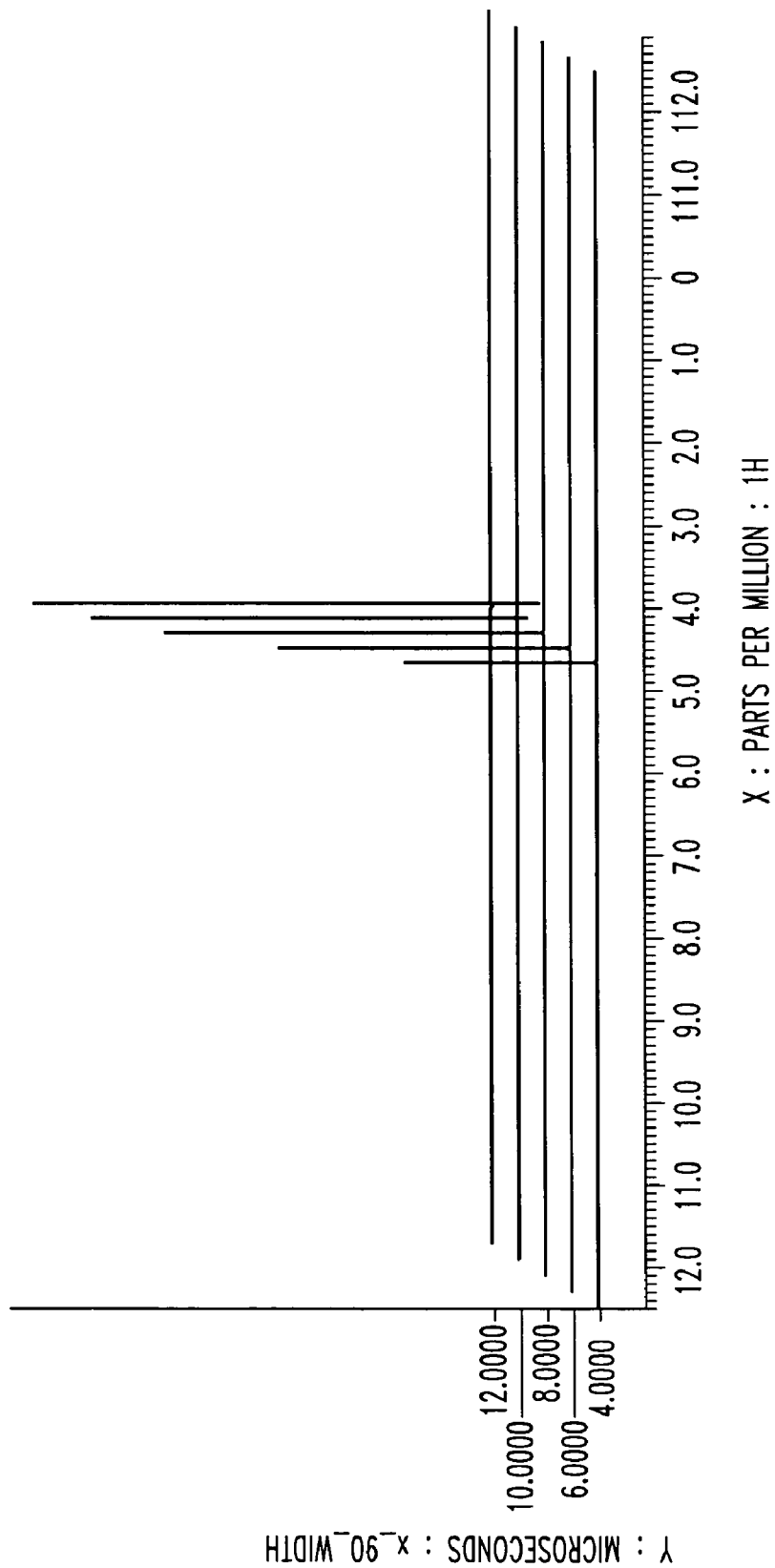
FIG. 13 is a diagram showing data obtained after processing.
Figure 14:
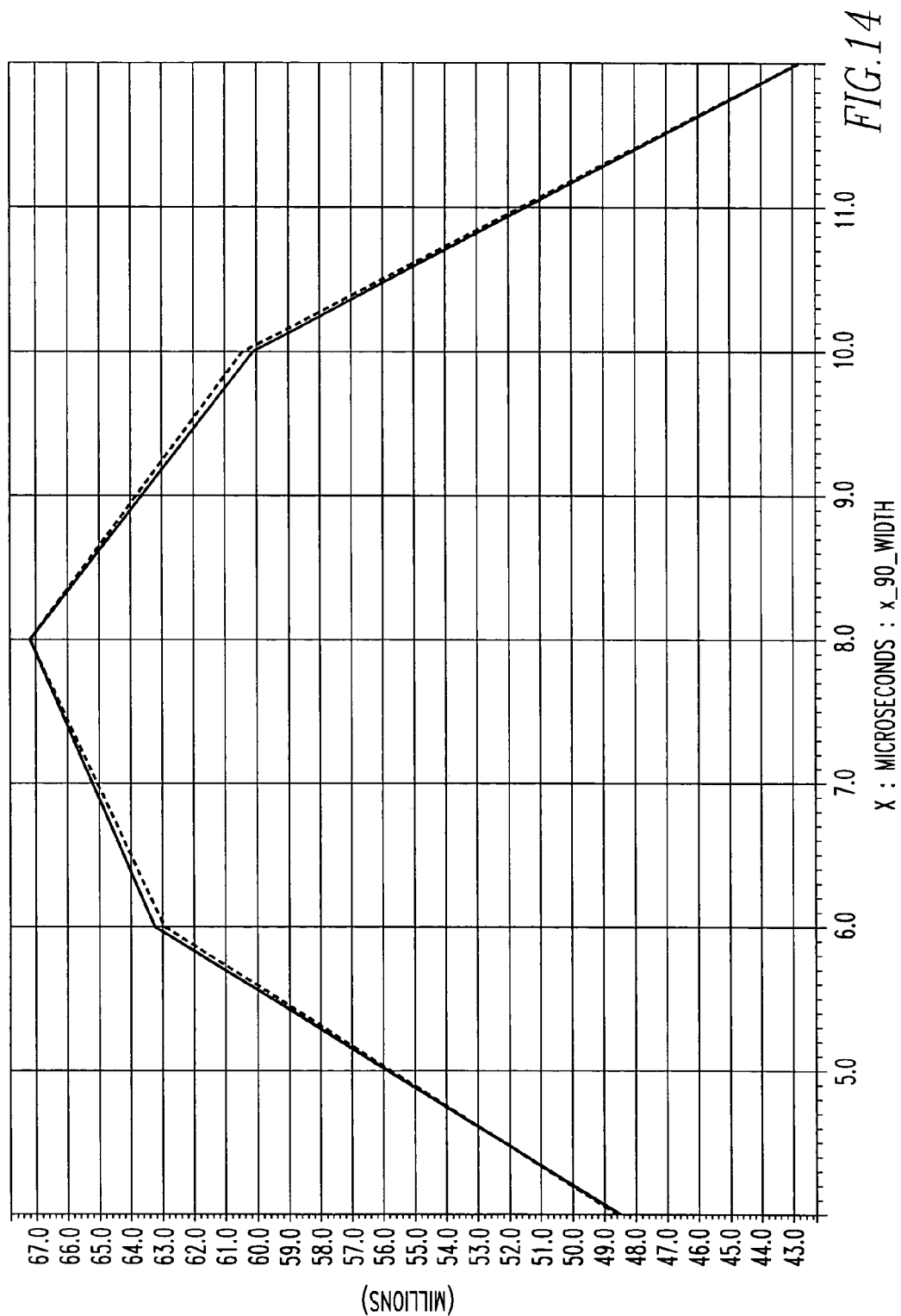
FIG. 14 is a graph showing a curve obtained by plotting integrated values.

In step 2, the measurement data are Fourier-transformed, and integrated values in the signal region are plotted along the values of the RF pulse width. In this way, a curve is created. This processing results in data shown in FIG. 13. Finding the integrated values from a signal existing region from 4 to 5.5 ppm produces results listed in Table 9. Plotting the results gives rise to the curve indicated by the solid line in FIG. 14.

TABLE 9

Results 3 of calculations of integrated values

| Index | x_90_width | Intensity |
|---|---|---|
| 1 | 4 µs | 48.48201 Mabn |
| 2 | 6 µs | 63.54521 Mabn |
| 3 | 8 µs | 67.35346 Mabn |
| 4 | 10 µs | 60.167 Mabn |
| 5 | 12 µs | 42.88578 Mabn |

In step 3, the linear least squares method is implemented using model equation (13). The results shown in Table 10 are obtained. Plotting of the contents of Table 10 using model equation (13) results in the curve indicated by the broken line in FIG. 14.

$$y = At^2 + Bt + C \tag{13}$$

TABLE 10

Results 3 of calculations of curve fitting

| Constant | Value |
|---|---|
| A | −1.35149 Mabn/µs$^2$ |
| B | 20.89533 Mabn/µs |
| C | −13.36858 Mabn |
| σ | 0.18738 Mabn |

Then, the values in Table 10 are substituted into Eq. (12), producing PW90=7.73047 µs as an optimum RF pulse width. The standard deviation σ in Table 10 gives an index of the reliability of the obtained RF pulse width.

$$PW90 = -\frac{B}{2A} \tag{14}$$

In the present embodiment, the step of obtaining the RF pulse width does not use visual estimation. Therefore, reproducible results can be obtained.

Figure 15:
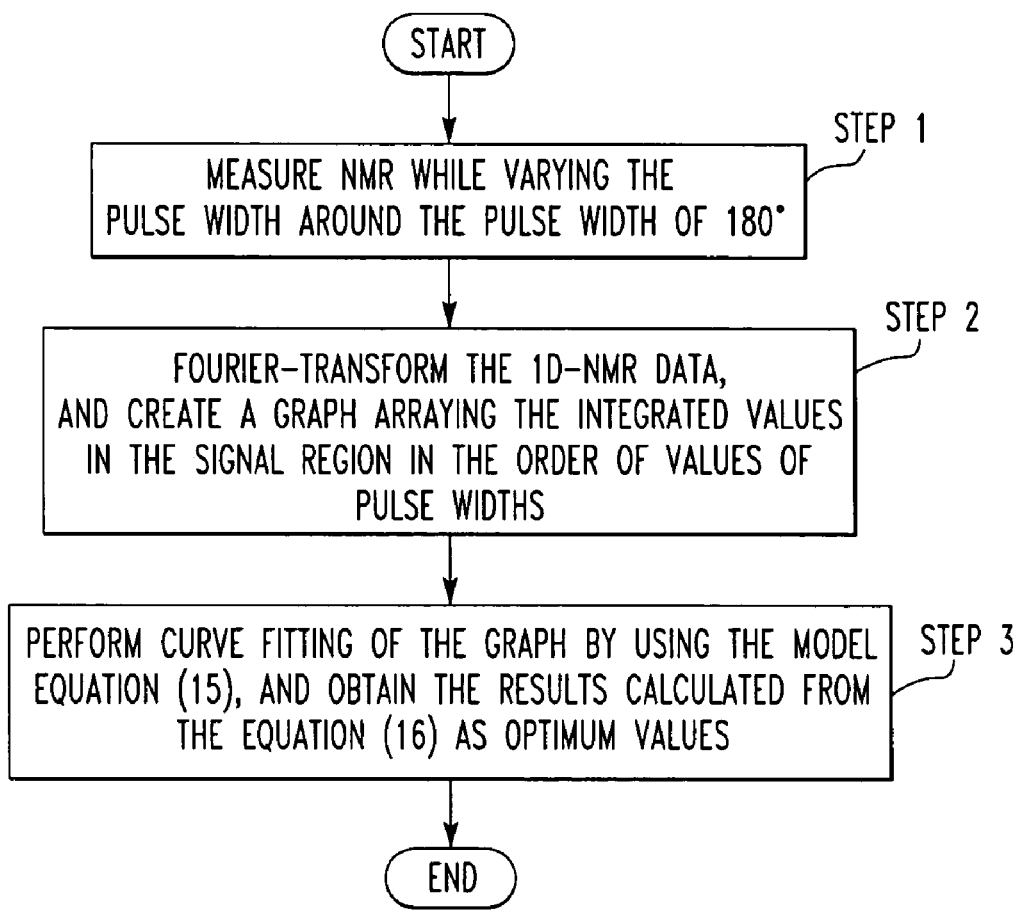
FIG. 15 is a flowchart illustrating Embodiment 4 of the present invention.

Embodiment 4 of the present invention is next described with reference to FIG. 15. Embodiment 4 is a method of finding an optimum RF pulse width by performing NMR measurements while varying the pulse width in the neighborhood of 180° pulse width. In the following description, it is assumed that it is previously known that the 180° pulse width is 14 µs because of the technique described as the prior art or information obtained from another technique.

Figure 16:
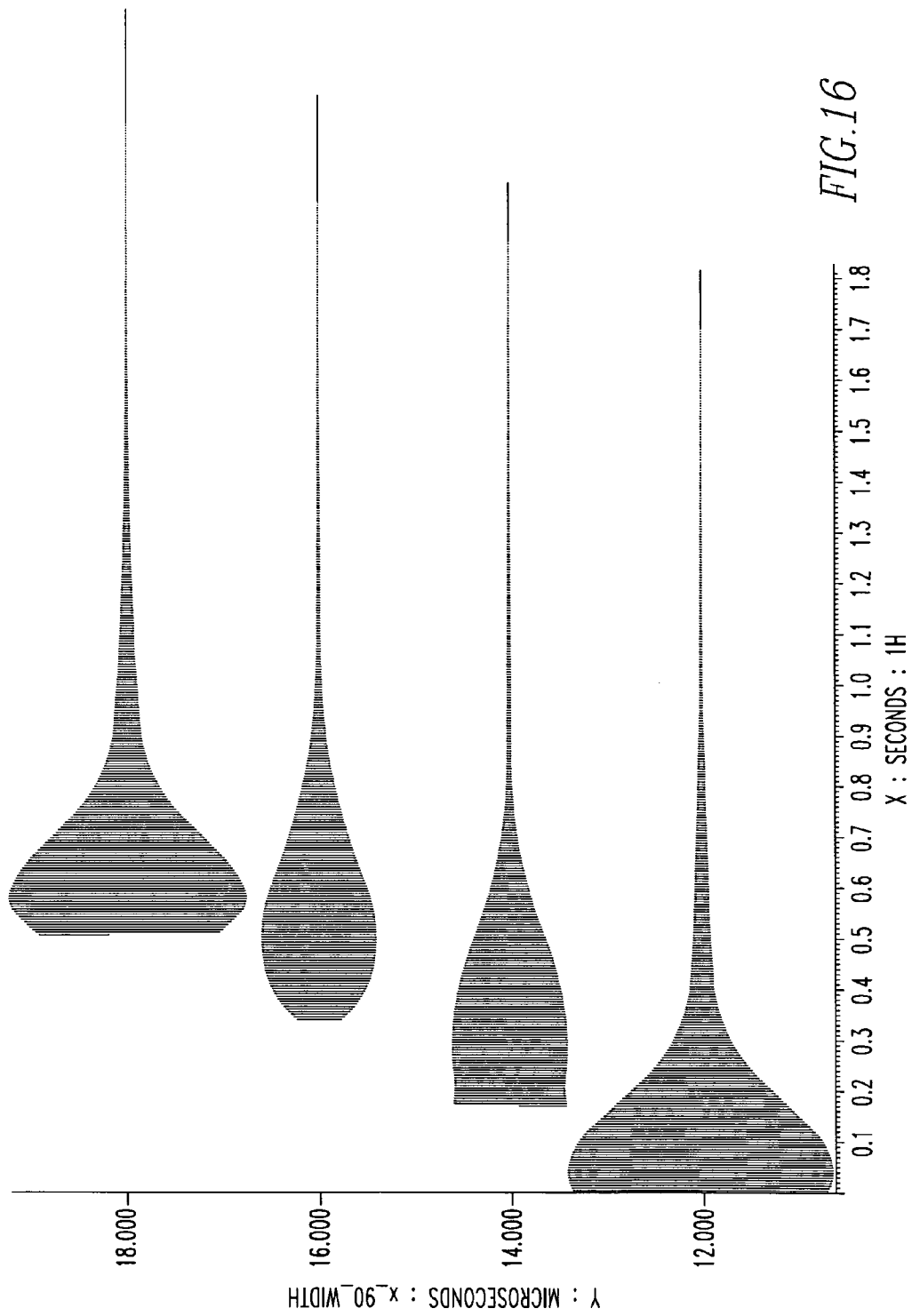
FIG. 16 is a diagram showing data obtained by a measurement in which an RF pulse width was varied.

In step 1, NMR measurements are performed while varying an RF pulse width from 12 to 18 µs (i.e., around 180° pulse width) in increments of 2 µs, using the measurement conditions shown in Table 1 and pulse sequence shown in FIG. 1(c), for example. The measurement data shown in FIG. 16 are obtained.

In step 2, the measurement data are Fourier-transformed, and integrated values in the signal region are plotted along the values of the RF pulse width. In this way, a curve is created. This processing results in data shown in FIG. 17. Finding the integrated values from a signal existing range from 4 to 5.5 ppm produces results listed in Table 11. Plotting the results gives rise to the curve indicated by the solid line in FIG. 18.

TABLE 11

Results 4 of calculations of integrated values

| Index | x_90_width | Intensity |
|---|---|---|
| 1 | 12 µs | 42.88578 Mabn |
| 2 | 14 µs | 18.76097 Mabn |
| 3 | 16 µs | −7.33509 Mabn |
| 4 | 18 µs | −30.59374 Mabn |

In step 3, the linear least squares method is implemented using model equation (11). The results shown in Table 12 are obtained. Plotting of the contents of Table 12 using model equation (11) results in the curve indicated by the broken line in FIG. 19.

TABLE 12

Results 4 of calculations of curve fitting

| Constant | Value |
|---|---|
| A | −12.32673 Mabn/µs |
| B | 190.83045 Mabn |
| σ | 0.66926 Mabn |

Then, the values in Table 12 are substituted into Eq. (14), producing PW90=7.74051 µs as an optimum RF pulse width. The standard deviation σ in Table 12 gives an index of the reliability of the obtained RF pulse width. In the present embodiment, the step of obtaining the RF pulse width does not use visual estimation. Therefore, reproducible results can be obtained.

Figure 19:
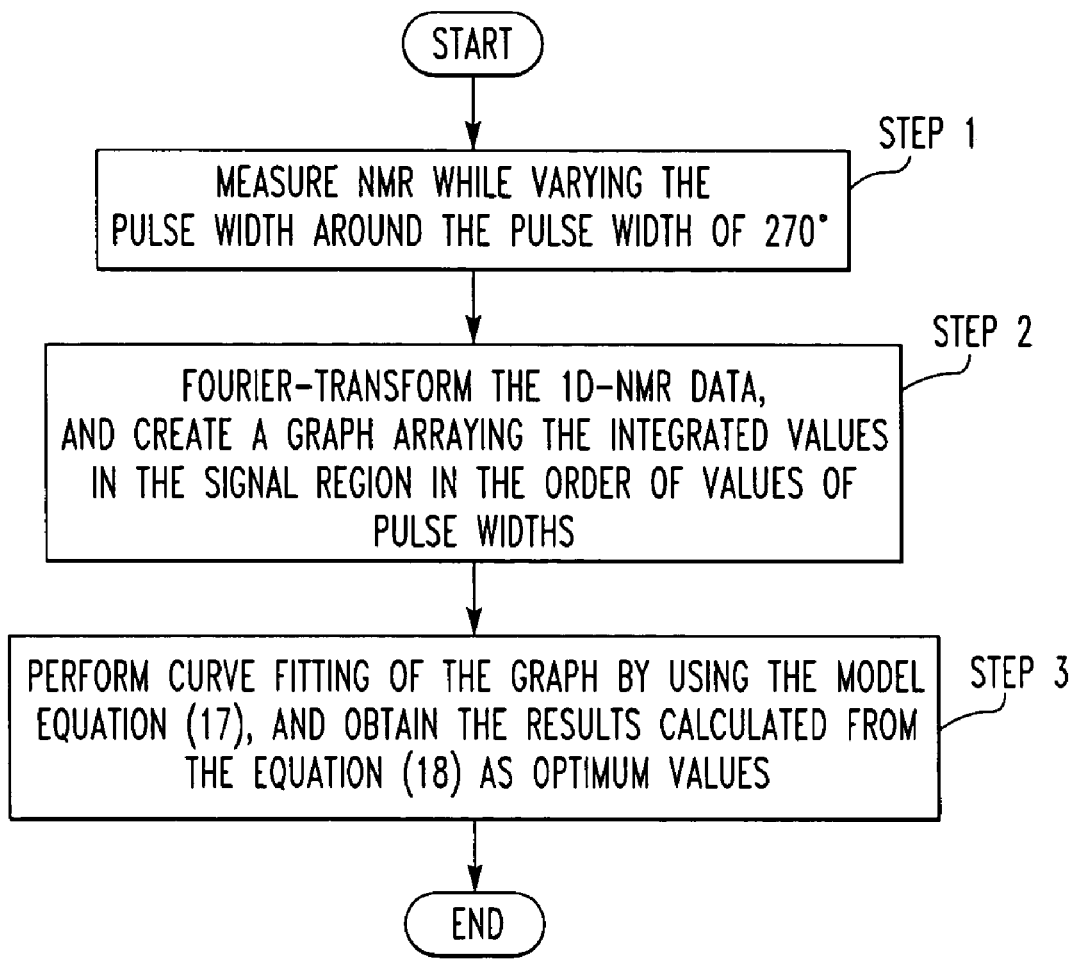
FIG. 19 is a flowchart illustrating Embodiment 5 of the present invention.

Embodiment 5 of the present invention is next described by referring to FIG. 19. Embodiment 5 is a method of finding an optimum RF pulse width by performing NMR measurements while varying the pulse width in the neighborhood of 270° pulse width. In the following description, it is assumed that it is previously known that the 270° pulse width is 21 µs because of the technique described as the prior art or information obtained from another technique.

Figure 20:
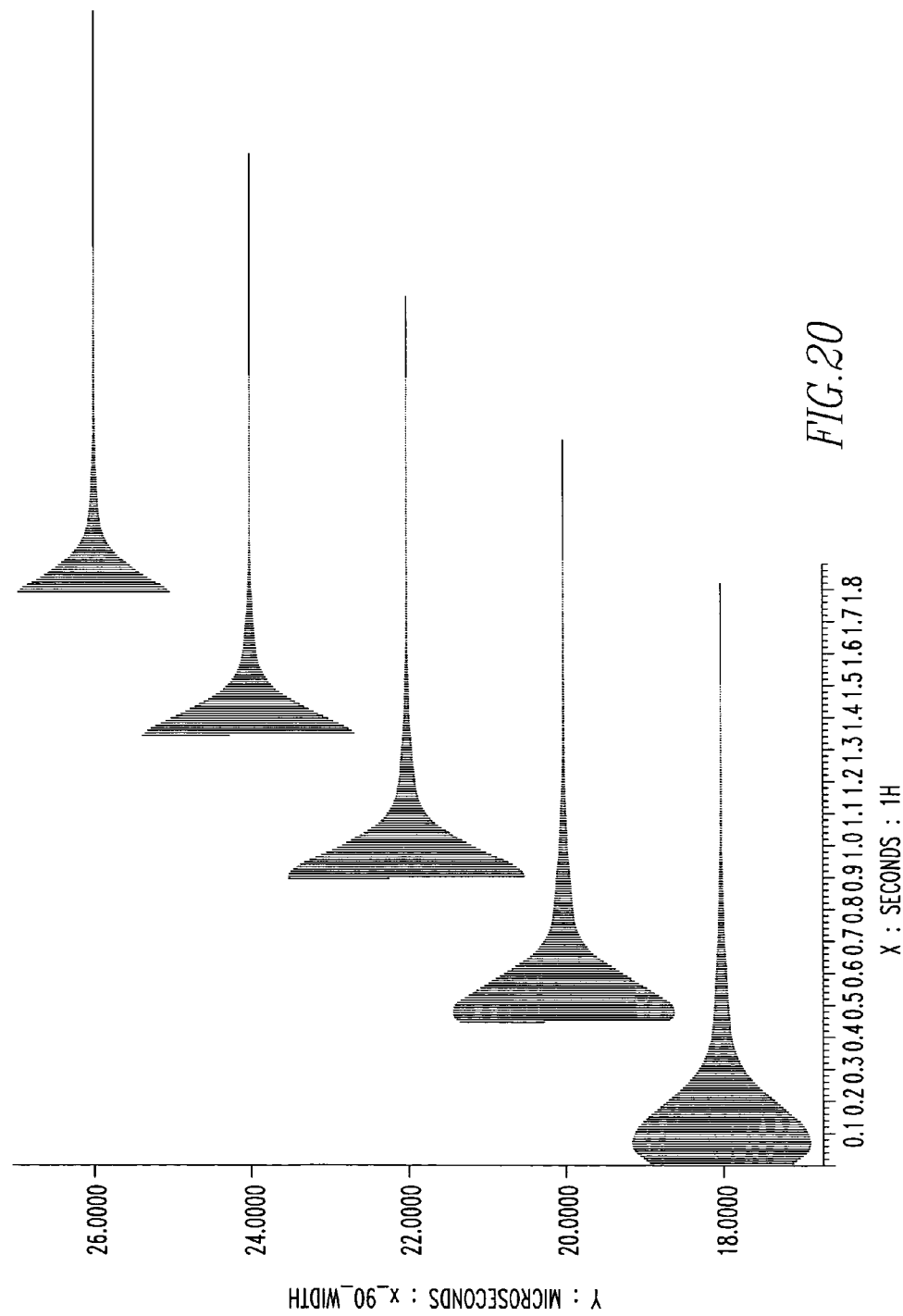
FIG. 20 is a diagram showing data obtained by a measurement in which an RF pulse width was varied.

In step 1, NMR measurements are performed while varying an RF pulse width from 18 to 26 µs (i.e., around 270° pulse width) in increments of 2 µs, using the measurement conditions shown in Table 1 and pulse sequence shown in FIG. 1(c), for example. The measurement data shown in FIG. 20 are obtained.

In step 2, the measurement data are Fourier-transformed, and integrated values in the signal region are plotted along the values of the RF pulse width. In this way, a curve is created. This processing results in data shown in FIG. 21. Finding the integrated values from a signal existing region 4 to 5.5 ppm produces results listed in Table 13. Plotting the results gives rise to the curve indicated by the solid line in FIG. 22.

TABLE 13

Results 5 of calculations of integrated values

| Index | x_90_width | Intensity |
|---|---|---|
| 1 | 18 µs | −30.59374 Mabn |
| 2 | 20 µs | −47.13169 Mabn |
| 3 | 22 µs | −53.43675 Mabn |
| 4 | 24 µs | −49.11459 Mabn |
| 5 | 26 µs | −35.15117 Mabn |

In step 3, the linear least squares method is implemented using model equation (13). The results shown in Table 14 are obtained. Plotting of the contents of Table 14 using model equation (13) results in the curve indicated by the broken line in FIG. 22.

TABLE 14

Results 5 of calculations of curve fitting

| Constant | Value |
|---|---|
| A | 1.27911 Mabn/µs$^2$ |
| B | −56.83557 Mabn/µs |
| C | 577.97661 Mabn |
| σ | 0.12472 Mabn |

Then, the values in Table 14 are substituted into Eq. (15), producing PW90=7.40563 µs as an optimum RF pulse width. The standard deviation σ in Table 14 gives an index of the reliability of the obtained RF pulse width.

$$PW90 = -\frac{B}{6A} \tag{15}$$

In the present embodiment, the step of obtaining the RF pulse width does not use visual estimation. Therefore, reproducible results can be obtained.

Figure 23:
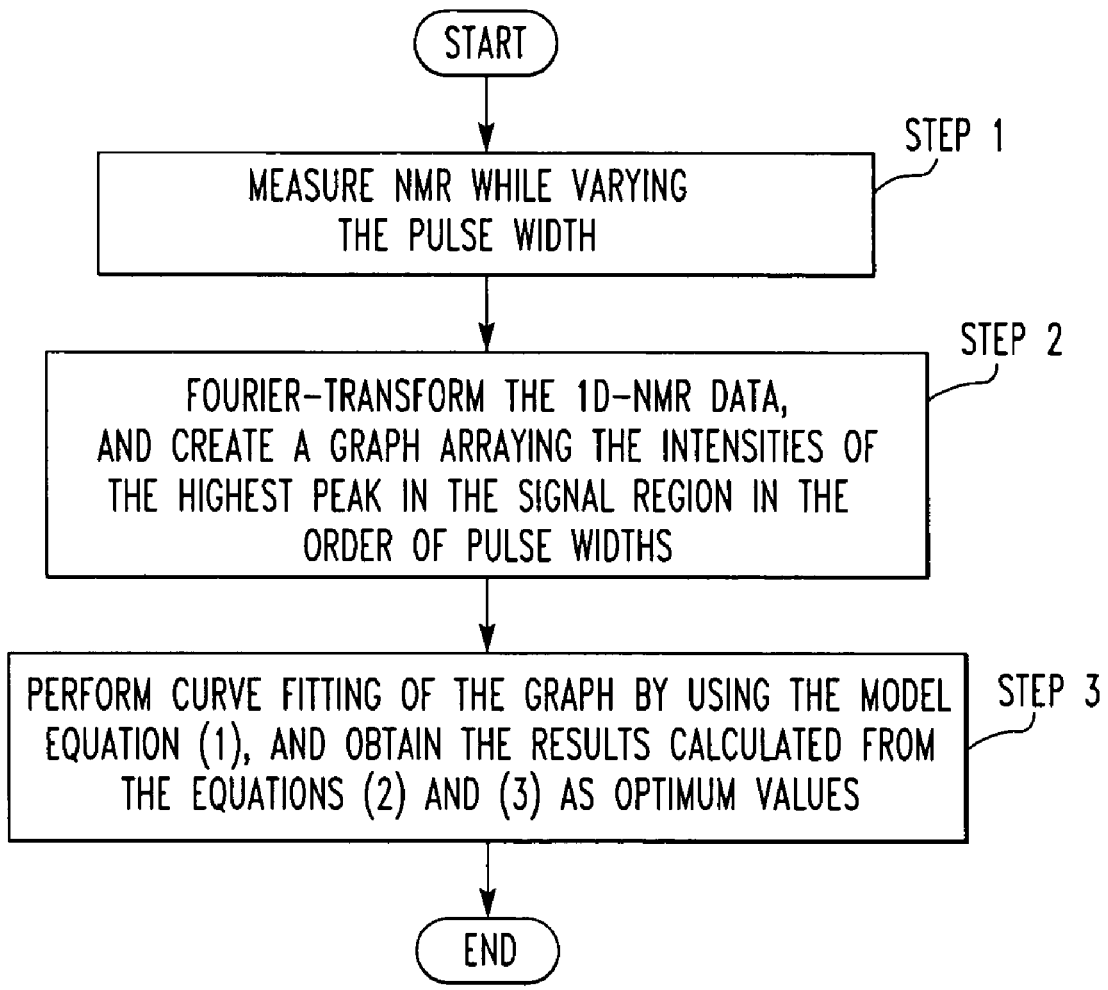
FIG. 23 is a flowchart illustrating Embodiment 6 of the present invention.

Embodiment 6 of the present invention is described with reference to FIG. 23. Embodiment 6 is a method of finding an optimum RF pulse width by performing NMR measurements while varying the pulse width in a range from 0 to 360° and using peak top intensities of a signal.

In step 1, NMR measurements are performed while varying an RF pulse width from 0 to 70 µs in increments of 2 µs, using the measurement conditions shown in Table 1 and pulse sequence shown in FIG. 1(c), for example. The measurement data shown in FIG. 2 are obtained.

In step 2, the measurement data are Fourier-transformed, and the top intensities of maximum peaks in the signal region are plotted along the values of the RF pulse width. This processing results in data as shown in FIG. 3. Finding the maximum peak top intensities in the signal existing region from 4 to 5.5 ppm produces the results listed in Table 15. Plotting the results gives rise to the curve indicated by the solid line in FIG. 24.

TABLE 15

Results 1 of calculations of peak top intensities

| Index | x_90_width | Intensity |
|---|---|---|
| 1 | 0 µs | −686.46028 abn |
| 2 | 2 µs | 1.432 Mabn |
| 3 | 4 µs | 2.91449 Mabn |
| 4 | 6 µs | 4.23296 Mabn |
| 5 | 8 µs | 5.27167 Mabn |
| 6 | 10 µs | 5.79026 Mabn |
| 7 | 12 µs | 5.3959 Mabn |
| 8 | 14 µs | 2.91626 Mabn |
| 9 | 16 µs | −2.4162 Mabn |
| 10 | 18 µs | −4.82156 Mabn |
| 11 | 20 µs | −5.28899 Mabn |
| 12 | 22 µs | −4.76431 Mabn |
| 13 | 24 µs | −3.77162 Mabn |
| 14 | 26 µs | −2.49942 Mabn |
| 15 | 28 µs | −1.0764 Mabn |
| 16 | 30 µs | 491.43929 Mabn |
| 17 | 32 µs | 1.87553 Mabn |

TABLE 15-continued

Results 1 of calculations of peak top intensities

| Index | x_90_width | Intensity |
|---|---|---|
| 18 | 34 µs | 3.17844 Mabn |
| 19 | 36 µs | 4.16982 Mabn |
| 20 | 38 µs | 4.73415 Mabn |
| 21 | 40 µs | 4.49485 Mabn |
| 22 | 42 µs | 2.71549 Mabn |
| 23 | 44 µs | −1.14449 Mabn |
| 24 | 46 µs | −3.60914 Mabn |
| 25 | 48 µs | −4.42519 Mabn |
| 26 | 50 µs | −4.20325 Mabn |
| 27 | 52 µs | −3.41928 Mabn |
| 28 | 54 µs | −2.343 Mabn |
| 29 | 56 µs | −1.08743 Mabn |
| 30 | 58 µs | 339.72675 Mabn |
| 31 | 60 µs | 1.5567 Mabn |
| 32 | 62 µs | 2.65856 Mabn |
| 33 | 64 µs | 3.52513 Mabn |
| 34 | 66 µs | 3.94934 Mabn |
| 35 | 68 µs | 3.63341 Mabn |
| 36 | 70 µs | 2.05146 Mabn |

In step 3, a curve fitting DFP method is performed in which the constants A, B, C, D, and $\omega$ of model equation (1) are varied such that model equation (1) agrees with the curve. Consequently, the results shown in Table 16 are obtained.

TABLE 16

Results 6 of calculations of curve fitting

| Constant | Value |
|---|---|
| A | 5780247.97088 abn |
| B | 0 rad |
| C | 165.63334 µs |
| D | 12119.0114 abn |
| $\omega$ | 0.21641 rad/µs |
| $\sigma$ | 964882.75674 abn |

Figure 24:
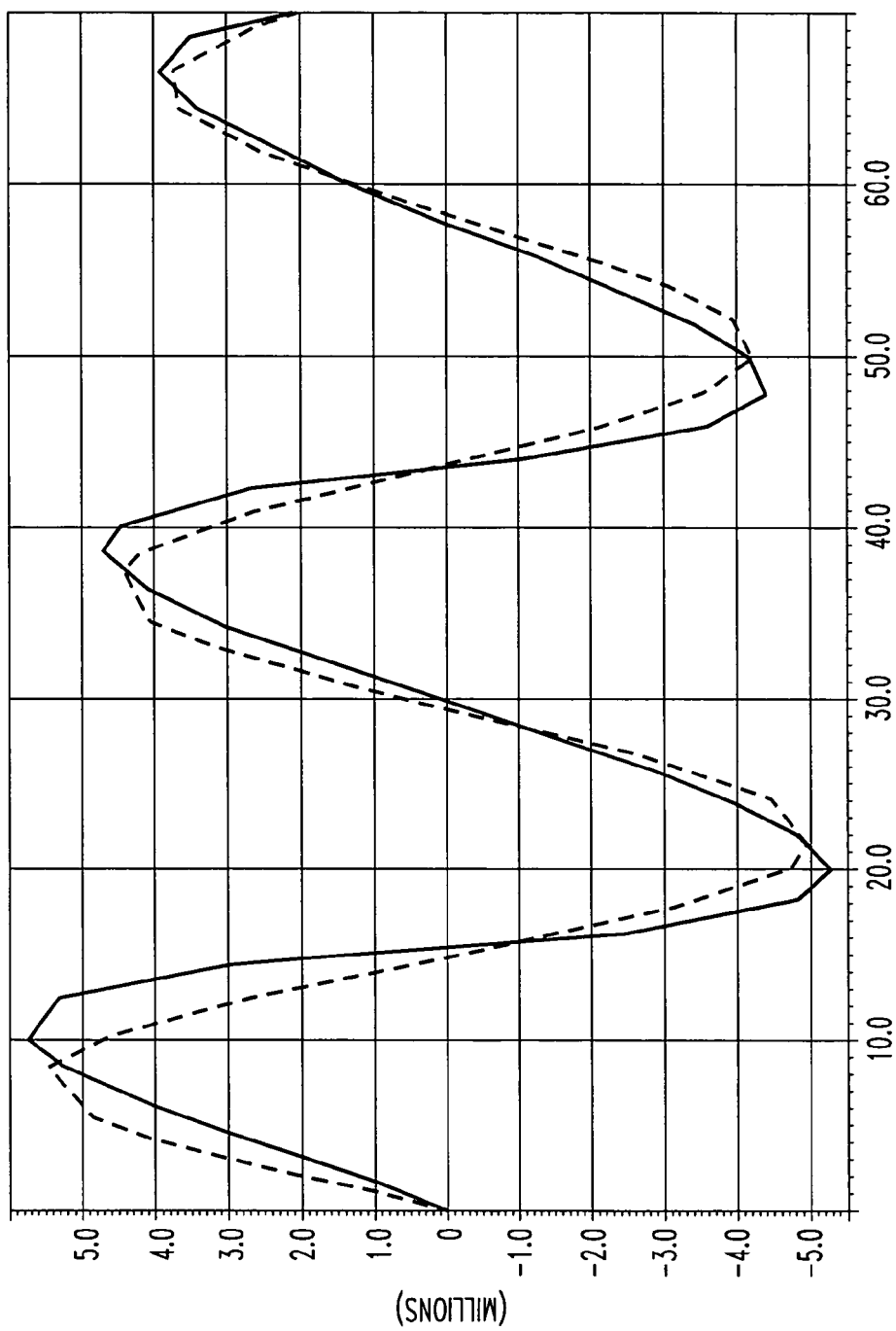
FIG. 24 is a graph showing a curve obtained by plotting peak top intensities.

Plotting of the values of Table 16 using model equation (1) produces the curve indicated by the broken line in FIG. 24. Substituting the values in Table 16 into Eq. (2) gives rises to PW360=29.03433 µs. This is substituted into Eq. (3), resulting in PW90=7.25858 µs as an optimum RF pulse width. The standard deviation $\sigma$ in Table 16 gives an index of the reliability of the obtained RF pulse width.

The method of finding the initial values of A, B, C, D, and $\omega$ in the curve fitting DFP method is the same as the method illustrated in FIG. 5(*b*). Accordingly, the procedure is described with reference to the flowchart of FIG. 5(*b*).

In step 1, the LPSVD method is used but calculations are unsuccessfully performed with no results. The program goes to step 3 where the number of times $n_1$ that the curve indicated by the solid line in FIG. 24 crosses straight line y=0 is found. Also, the RF pulse widths zp[1], . . . , zp[n1] produced at this time are found. The results shown in Table 17 are obtained.

TABLE 17

Intersection 2 with y = 0

| Item | Value |
|---|---|
| $n_1$ | 5 |
| zp[1] | 0.00096 µs |

TABLE 17-continued

Intersection 2 with y = 0

| Item | Value |
|---|---|
| zp[2] | 15.09378 µs |
| zp[3] | 29.3731 µs |
| zp[4] | 43.407 µs |
| zp[5] | 57.52391 µs |

In step 4, the results shown in Table 17 are substituted into Eq. (6). As an initial value of $\omega$, we obtain $\omega$=0.21846 rad/µs.

In step 5, the number of positive-going (upward) peaks $n_2$ of the curve indicated by the solid line of FIG. 24, the RF pulse widths pp[1], . . . , pp[$n_2$] at the tops of the peaks, and the intensities pi[1], . . . , pi[$n_2$] of the tops of the peaks are found. The results listed in Table 18 are obtained.

TABLE 18

Tops 2 of peaks

| Item | Value |
|---|---|
| $n_2$ | 3 |
| pp[1] | 10 µs |
| pp[2] | 38 µs |
| pp[3] | 66 µs |
| pi[1] | 5.79026 Mabn |
| pi[2] | 4.73415 Mabn |
| pi[3] | 3.94934 Mabn |

In step 6, the results shown in Table 18 are substituted into Eq. (7). We obtain C=146.35619 µs as an initial value of C.

In step 7, the values of $\omega$ and C calculated in steps 4 and 6 are substituted into Eq. (8). Using each item as a basis function and employing the curve indicated by the solid line in FIG. 24, the linear least squares method is implemented. The results (optimum constant values D, E, and F) listed in Table 19 are obtained.

TABLE 19

Results 2 of calculations of linear least squares method

| Item | Value |
|---|---|
| D | 46209.1885 abn |
| E | 5919590.1939 abn |
| F | −796281.22262 abn |

In step 8, the results shown in Table 19 are substituted into Eqs. (9), (10-1), and (10-2), resulting in A=5972906.48254 abn and B=0.13371 rad.

The values calculated in this way are taken as initial values in the DFP method. These values are varied. The values of A, B, C, D, and $\omega$ that minimize the value of evaluation formula (4) are found. Where the initial values of the DFP method are used, in a case where measurement conditions as listed in Table 1 and the pulse sequence shown in FIG. 1(*c*) are used, for example, it is known that B=0 rad. Therefore, the DFP method is so implemented that the constants A, C, D, and $\omega$ are varied while the constant B of model equation (1) is kept at 0 rad.

In the present embodiment, the step of obtaining an optimum RF pulse width contains no manual operation and so reproducible results can be obtained.

Figure 25:
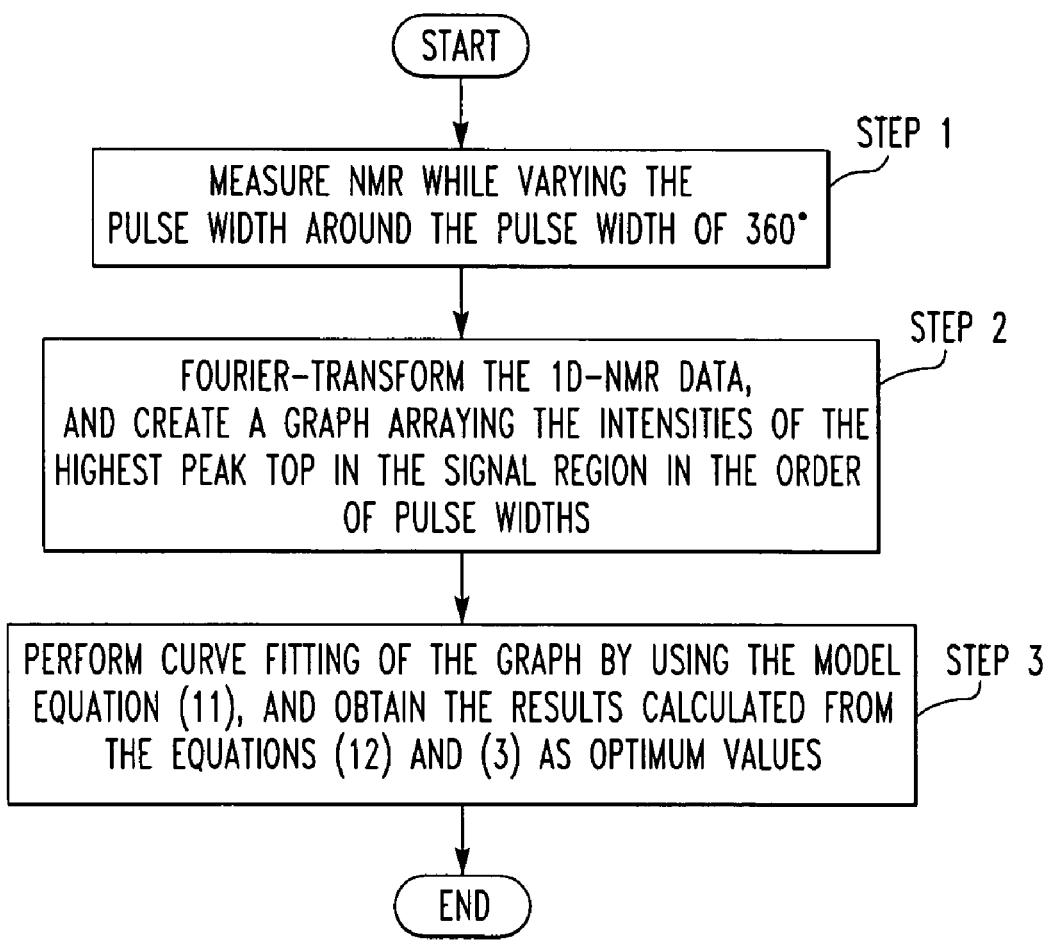
FIG. 25 is a flowchart illustrating Embodiment 7 of the present invention.

Embodiment 7 of the present invention is described by referring to FIG. 25. Embodiment 7 is a method of finding an optimum RF pulse width by performing NMR measurements while varying the RF pulse width in the neighborhood of 360° pulse width. In the following description, it is assumed that it is previously known that the 360° pulse width is 28 μs because of the technique described as the prior art or information obtained from another technique.

In step 1, NMR measurements are performed while varying an RF pulse width from 24 to 34 μs (i.e., around 360° pulse width) in increments of 2 μs, using the measurement conditions shown in Table 1 and pulse sequence shown in FIG. 1(c), for example. The measurement data shown in FIG. 8 are obtained.

Figure 9:
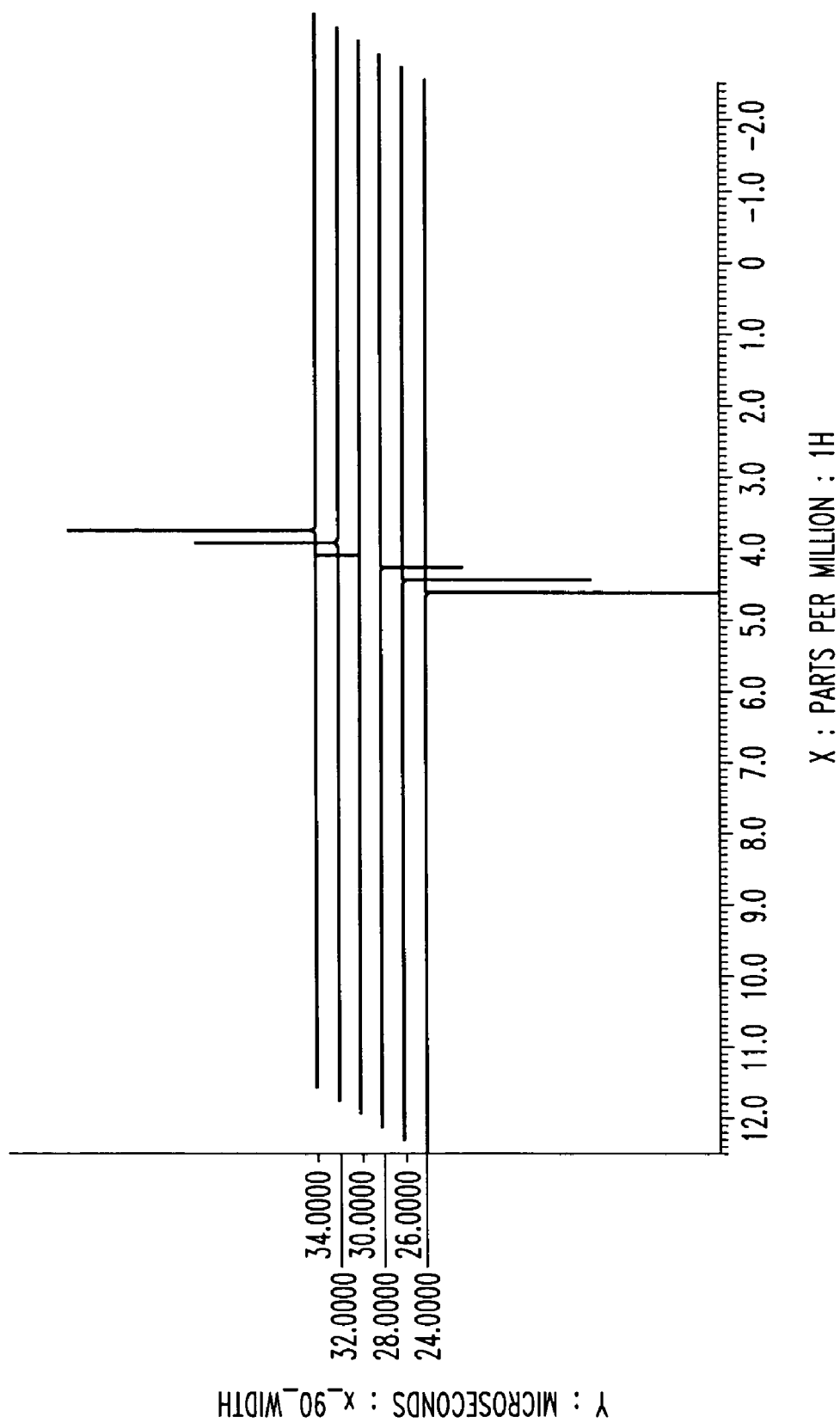
FIG. 9 is a diagram showing data obtained after processing.
Figure 10:
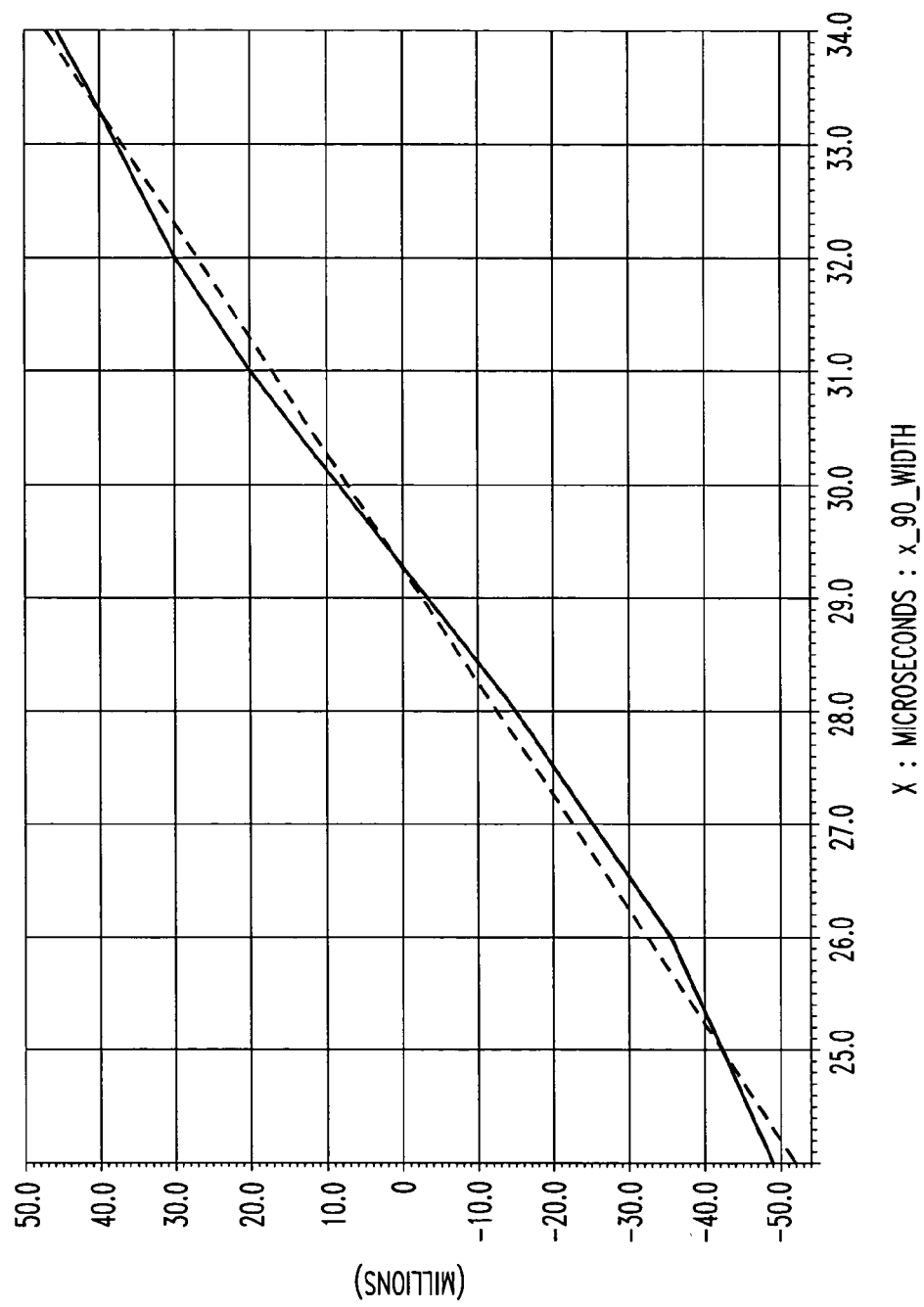
FIG. 10 is a diagram showing a curve obtained by plotting integrated values.
Figure 26:
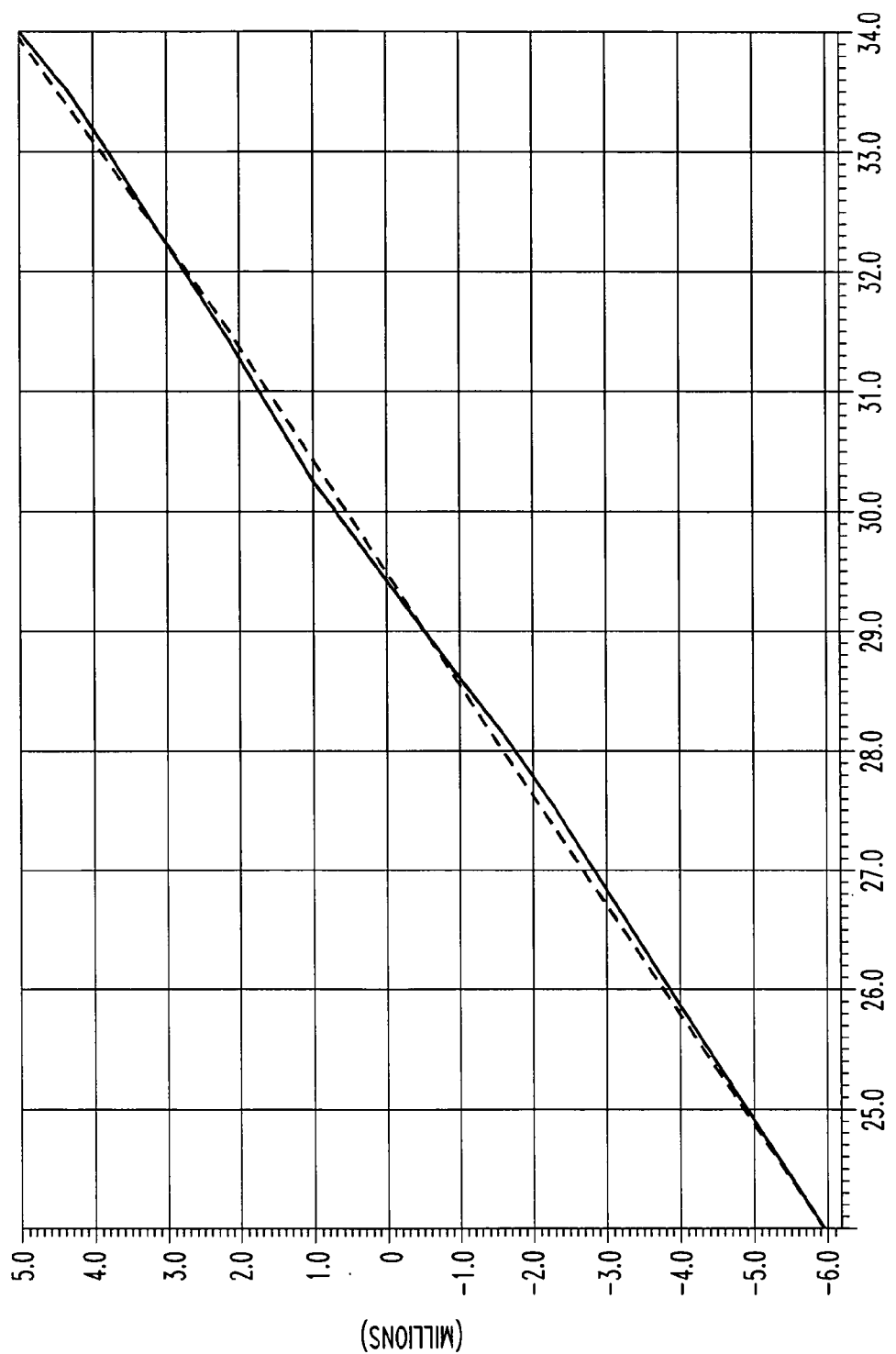
FIG. 26 is a graph showing a curve obtained by plotting peak top intensities.

In step 2, the measurement data are Fourier-transformed, and the top intensities of maximum peaks in the signal region are plotted along the values of the RF pulse width. This processing results in data as shown in FIG. 9. Finding the top intensities of maximum peaks in a signal existing region from 4 to 5.5 ppm produces results listed in Table 20. Plotting the results gives rise to the curve indicated by the solid line in FIG. 26.

TABLE 20

Results 2 of calculations of peak top intensities

| Index | x_90_width | Intensity |
|---|---|---|
| 1 | 24 μs | −5.96076 Mabn |
| 2 | 26 μs | −3.78569 Mabn |
| 3 | 28 μs | −1.6393 Mabn |
| 4 | 30 μs | 873.45073 kabn |
| 5 | 32 μs | 2.8408 Mabn |
| 6 | 34 μs | 4.99155 Mabn |

In step 3, the linear least squares method is implemented using model equation (11). The results shown in Table 21 are obtained. Plotting of the contents of Table 21 using model equation (11) results in the curve indicated by the broken line in FIG. 26.

TABLE 21

Results 7 of calculations of curve fitting

| Constant | Value |
|---|---|
| A | 1.1022 Mabn/μs |
| B | −32.41038 Mabn |
| σ | 0.11171 Mabn |

Then, the values in Table 21 are substituted into Eq. (12), producing PW360=29.40524 μs. This is substituted into Eq. (3), giving rise to PW90=7.35131 μs as an optimum RF pulse width. The standard deviation σ in Table 21 gives an index of the reliability of the obtained RF pulse width.

In the present, the step of obtaining an optimum RF pulse width does not use visual estimation. Therefore, reproducible results can be obtained.

Figure 27:
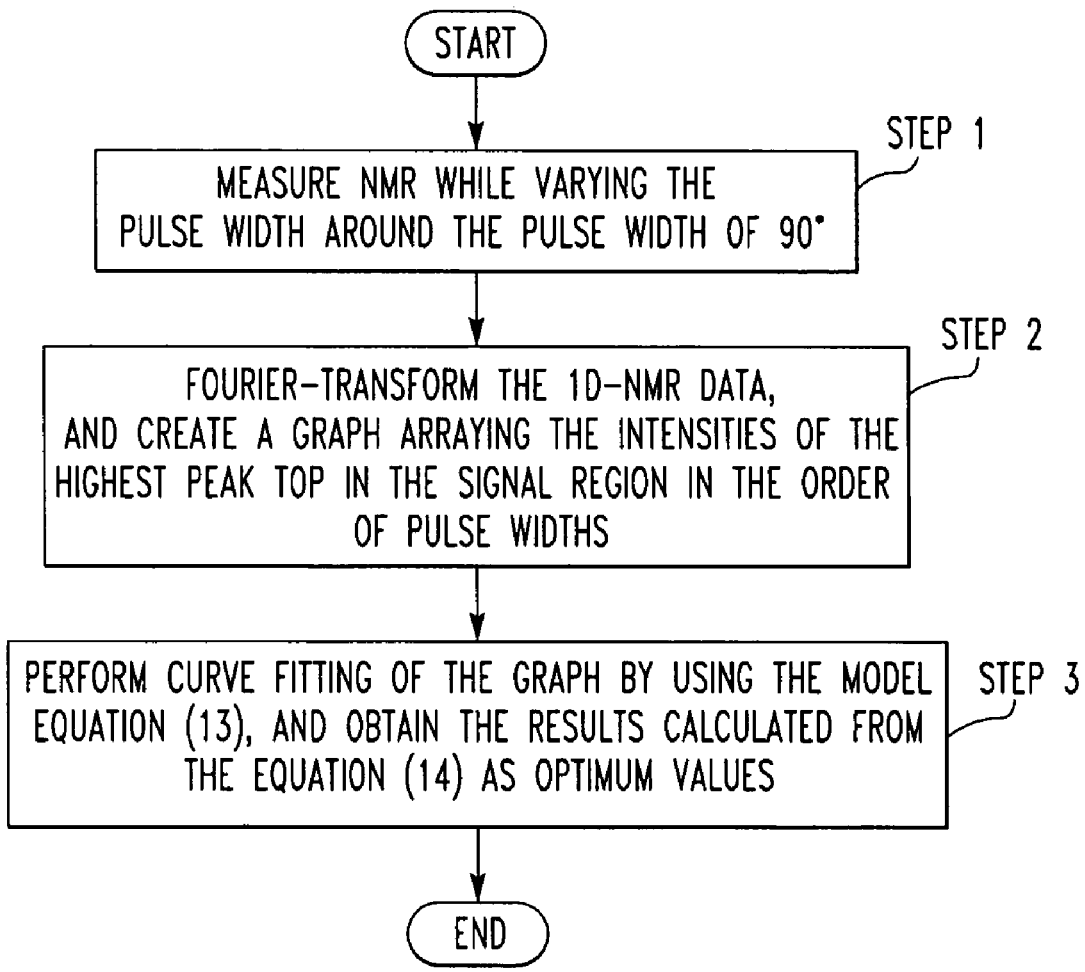
FIG. 27 is a flowchart illustrating Embodiment 8 of the present invention.

Embodiment 8 of the present invention is next described with reference to FIG. 27. Embodiment 8 is a method of finding an optimum RF pulse width by performing NMR measurements while varying the RF pulse width in the neighborhood of 90° pulse width and by using the peak top intensities of the signal. In the following description, it is assumed that it is previously known that the 90° pulse width is 7 μs because of the technique described as the prior art or information obtained from another technique.

In step 1, NMR measurements are performed while varying an RF pulse width from 4 to 12 μs (i.e., around 90° pulse width) in increments of 2 μs, using the measurement conditions show in Table 1 and pulse sequence shown in FIG. 1(c). The measurement data shown in FIG. 12 are obtained.

Figure 28:
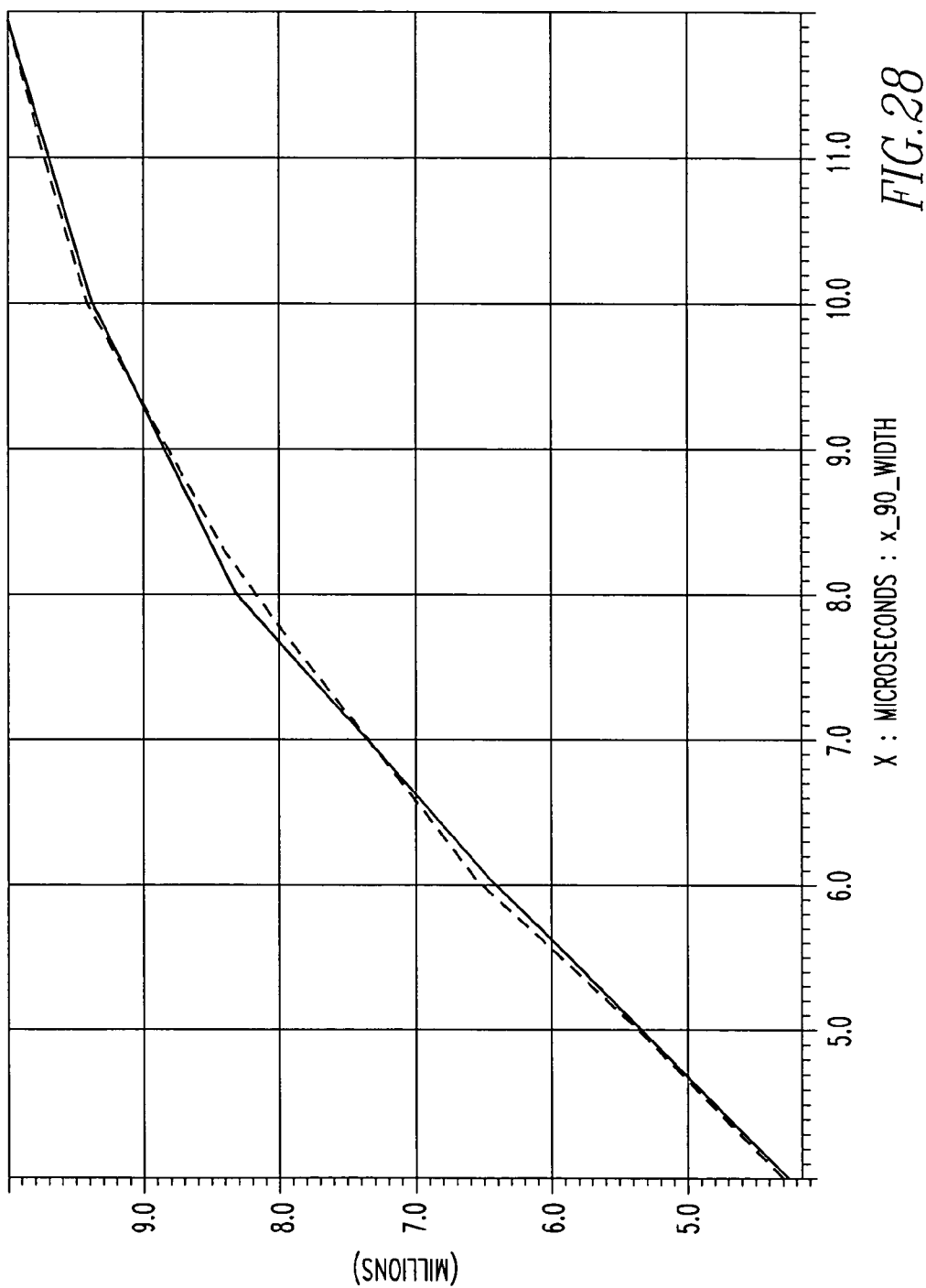
FIG. 28 is a graph showing a curve obtained by plotting peak top intensities.

In step 2, the measurement data are Fourier-transformed, and the top intensities of the maximum peaks in the signal region are plotted along the values of the RF pulse width. This processing results in data shown in FIG. 13. Finding the top intensities of the maximum peaks in a signal existing range from 4 to 5.5 ppm produces results listed in Table 22. Plotting the results gives rise to the curve indicated by the solid line in FIG. 28.

TABLE 22

Results 3 of calculations of peak top intensities

| Index | x_90_width | Intensity |
|---|---|---|
| 1 | 4 μs | 4.27768 Mabn |
| 2 | 6 μs | 6.43286 Mabn |
| 3 | 8 μs | 8.34666 Mabn |
| 4 | 10 μs | 9.39558 Mabn |
| 5 | 12 μs | 10.03132 Mabn |

In step 3, the linear least squares method is implemented using model equation (13). The results shown in Table 23 are obtained. Plotting of the contents of Table 23 using model equation (13) results in the curve indicated by the broken line in FIG. 28.

TABLE 23

Results 8 of calculations of curve fitting

| Constant | Value |
|---|---|
| A | −0.069719 Mabn/μs² |
| B | 1.83886 Mabn/μs |
| C | −1.99495 Mabn |
| σ | 0.06976 Mabn |

Then, the values in Table 23 are substituted into Eq. (14), producing PW90=13.18934 μs as an optimum RF pulse width. The standard deviation σ in Table 12 gives an index of the reliability of the obtained RF pulse width.

In the present embodiment, the step of obtaining the optimum RF pulse width does not use visual estimation. Therefore, reproducible results can be obtained.

Figure 29:
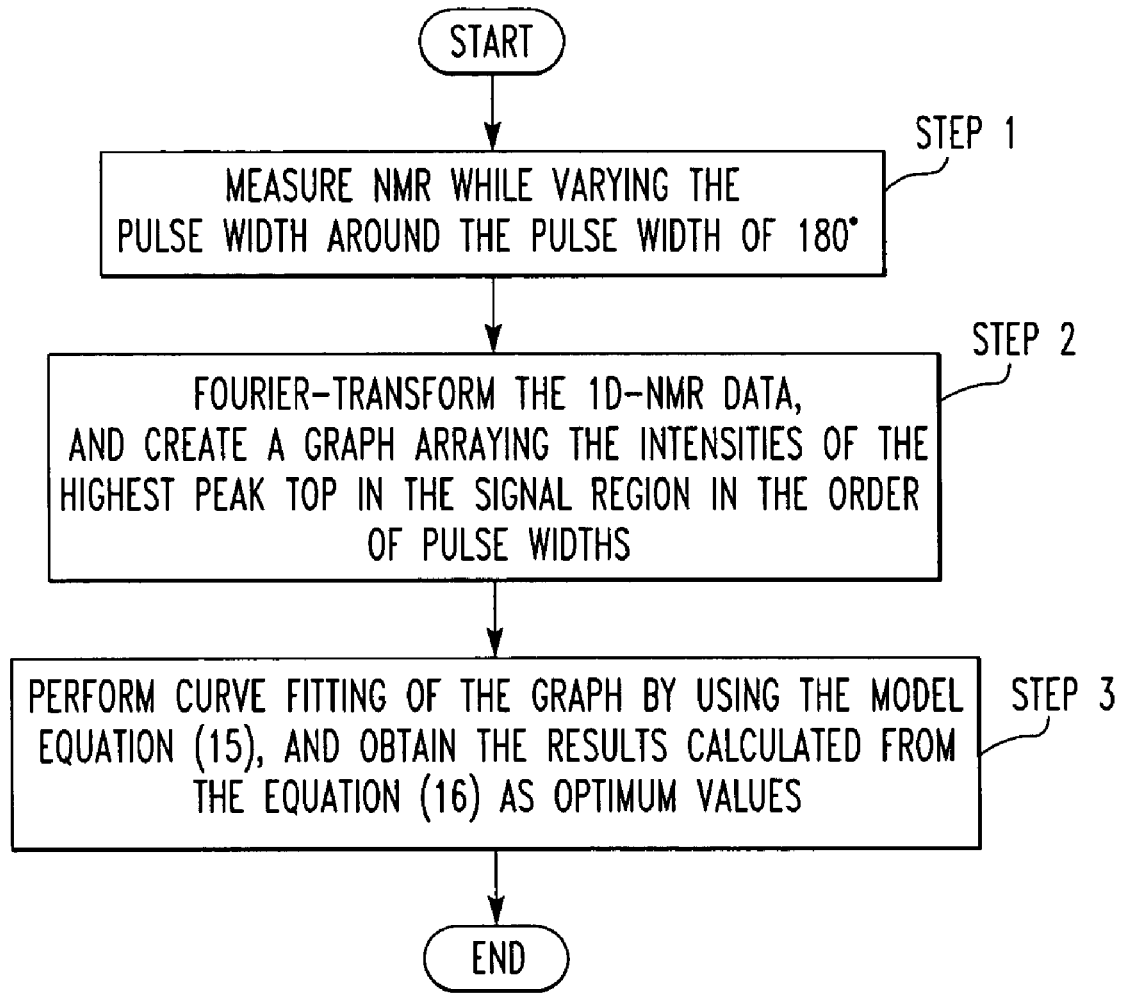
FIG. 29 is a flowchart illustrating Embodiment 9 of the present invention.

Embodiment 9 of the present invention is described by referring to FIG. 29. Embodiment 9 is a method of finding an optimum RF pulse width by performing NMR measurements while varying the RF pulse width in the neighborhood of 180° pulse width and using the peak top intensities of the signal. In the following description, it is assumed that it is previously known that the 180° pulse width is 14 μs because of the technique described as the prior art or information obtained from another technique.

In step 1, NMR measurements are performed while varying an RF pulse width from 12 to 18 μs (i.e., around 180° pulse width) in increments of 2 μs, using the measurement conditions shown in Table 1 and pulse sequence shown in FIG. 1(c), for example. The measurement data shown in FIG. 16 are obtained.

Figure 17:
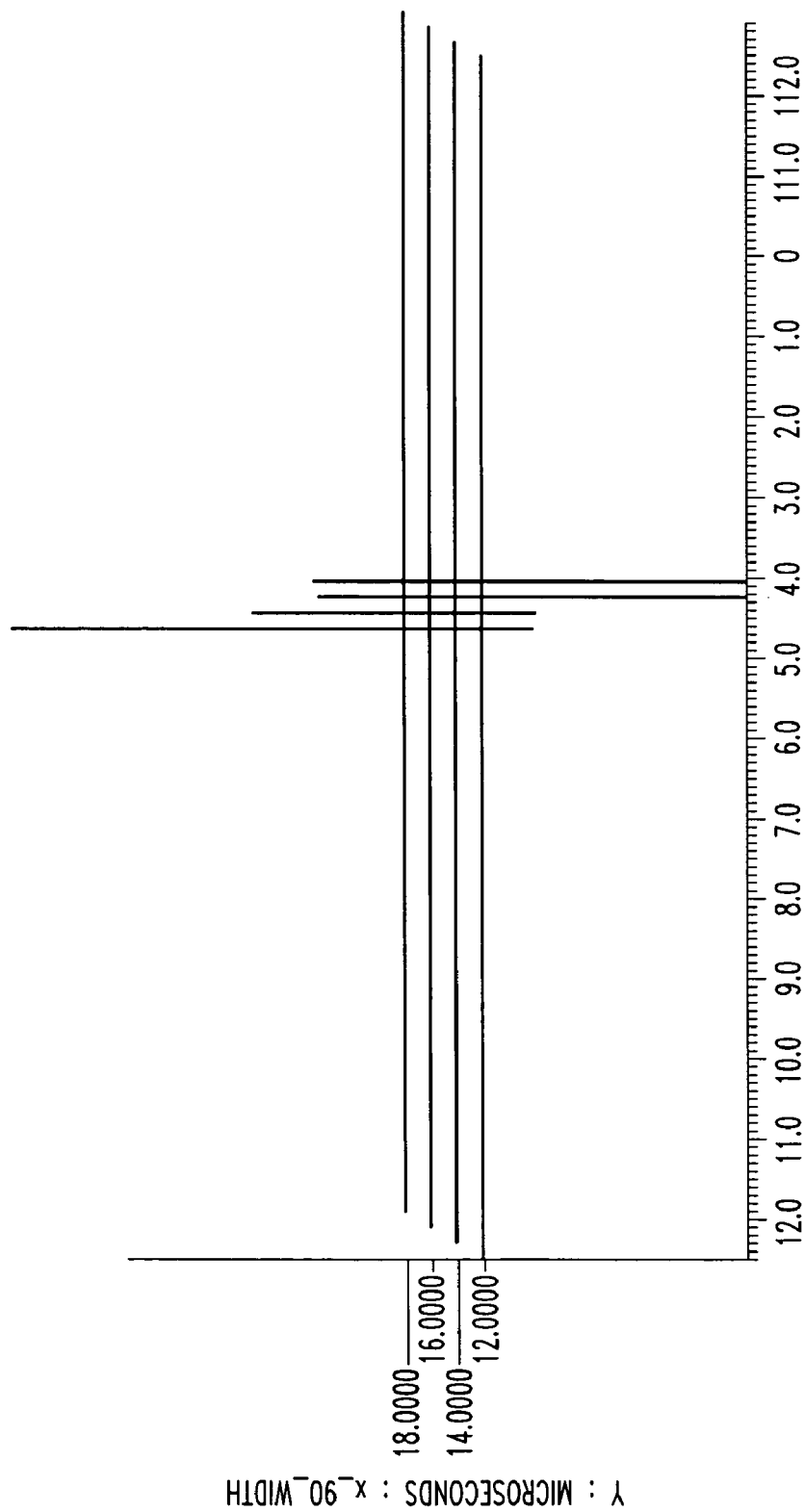
FIG. 17 is a diagram showing data obtained after processing.
Figure 18:
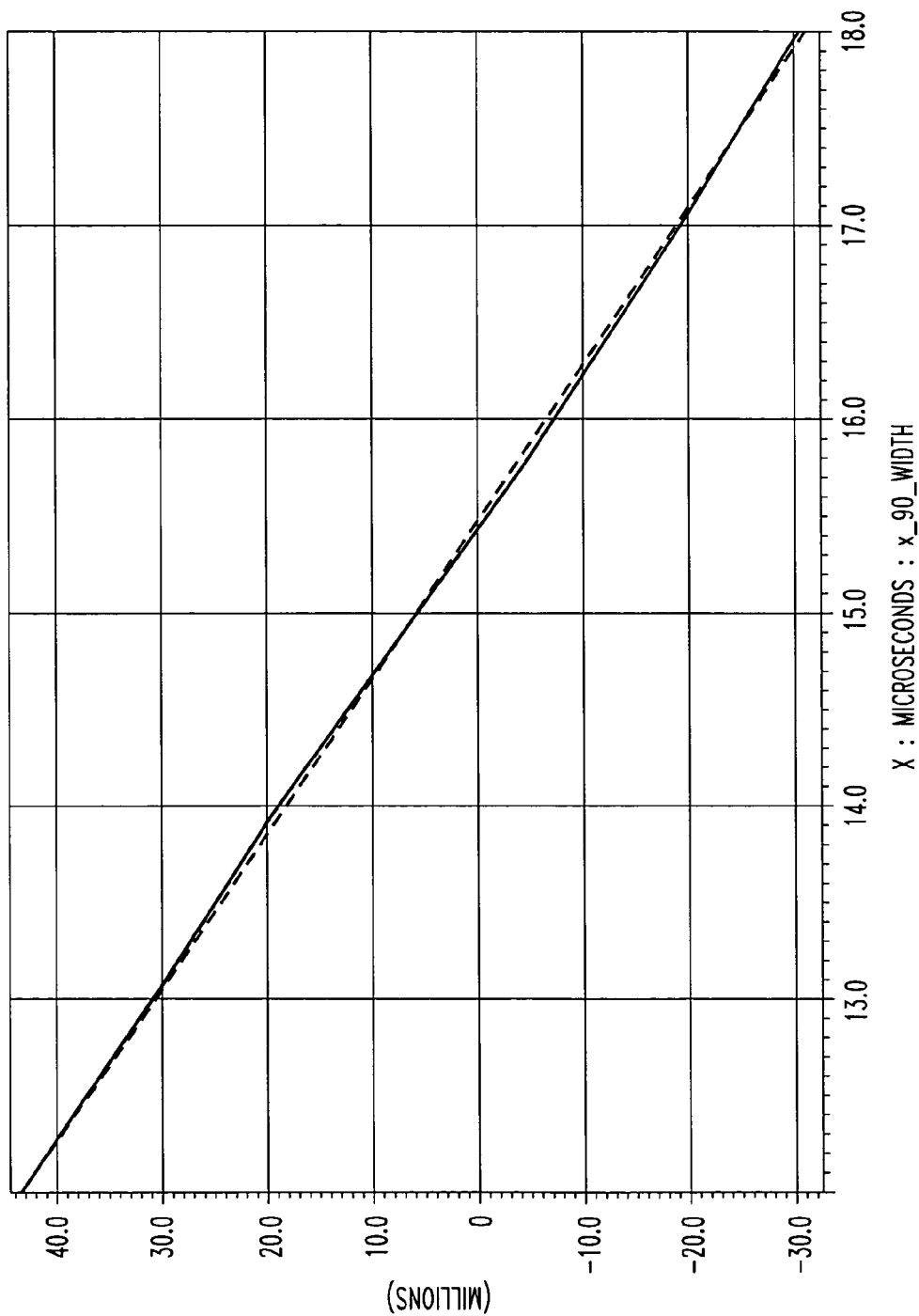
FIG. 18 is a diagram showing a curve obtained by plotting integrated values.
Figure 30:
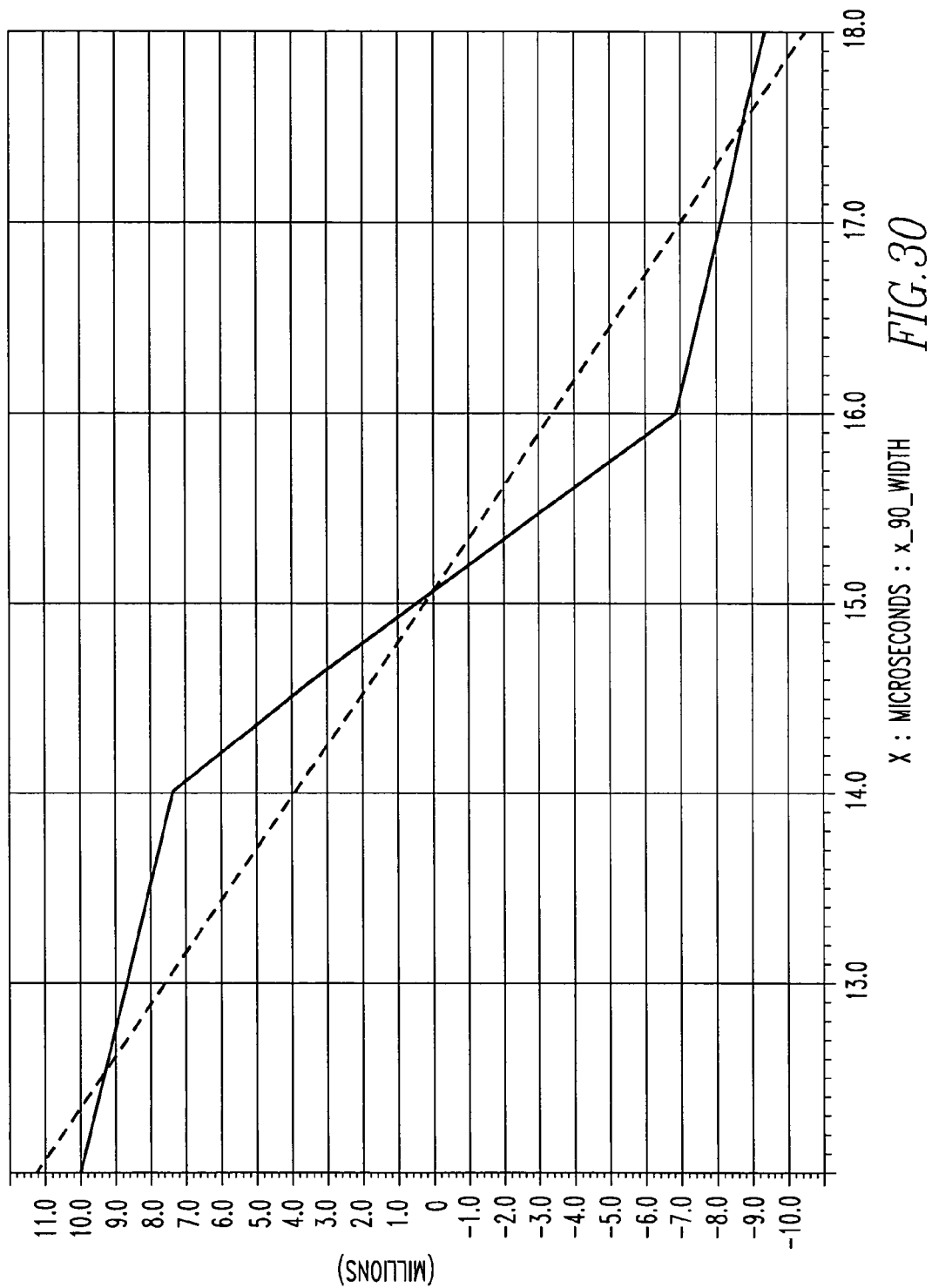
FIG. 30 is a graph showing a curve obtained by plotting peak top intensities.

In step 2, the measurement data are Fourier-transformed and the top intensities of the maximum peaks in the signal region are plotted along the values of the RF pulse width. This processing results in data as shown in FIG. 17. Finding the peak top intensities of the maximum peaks in a signal existing range from 4 to 5.5 ppm produces results listed in Table 24. Plotting the results gives rise to the curve indicated by the solid line in FIG. 30.

TABLE 24

Results 4 of calculations of peak top intensities

| Index | x_90_width | Intensity |
|---|---|---|
| 1 | 12 μs | 10.03132 Mabn |
| 2 | 14 μs | 7.52695 Mabn |
| 3 | 16 μs | −6.83314 Mabn |
| 4 | 18 μs | −9.34702 Mabn |

In step 3, the linear least squares method is implemented using model equation (11). The results shown in Table 25 are obtained. Plotting of the contents of Table 25 using model equation (11) results in the curve indicated by the broken line in FIG. 30.

TABLE 25

Results 9 of calculations of curve fitting

| Constant | Value |
|---|---|
| A | −3.62476 Mabn/μs |
| B | 54.71586 Mabn |
| σ | 3.05991 Mabn |

Then, the values in Table 25 are substituted into Eq. (14), producing PW90=7.54752 μs as an optimum RF pulse width. The standard deviation σ in Table 25 gives an index of the reliability of the obtained RF pulse width. In the present embodiment, the step of obtaining the optimum RF pulse width does not use visual estimation. Therefore, reproducible results can be obtained.

Figure 31:
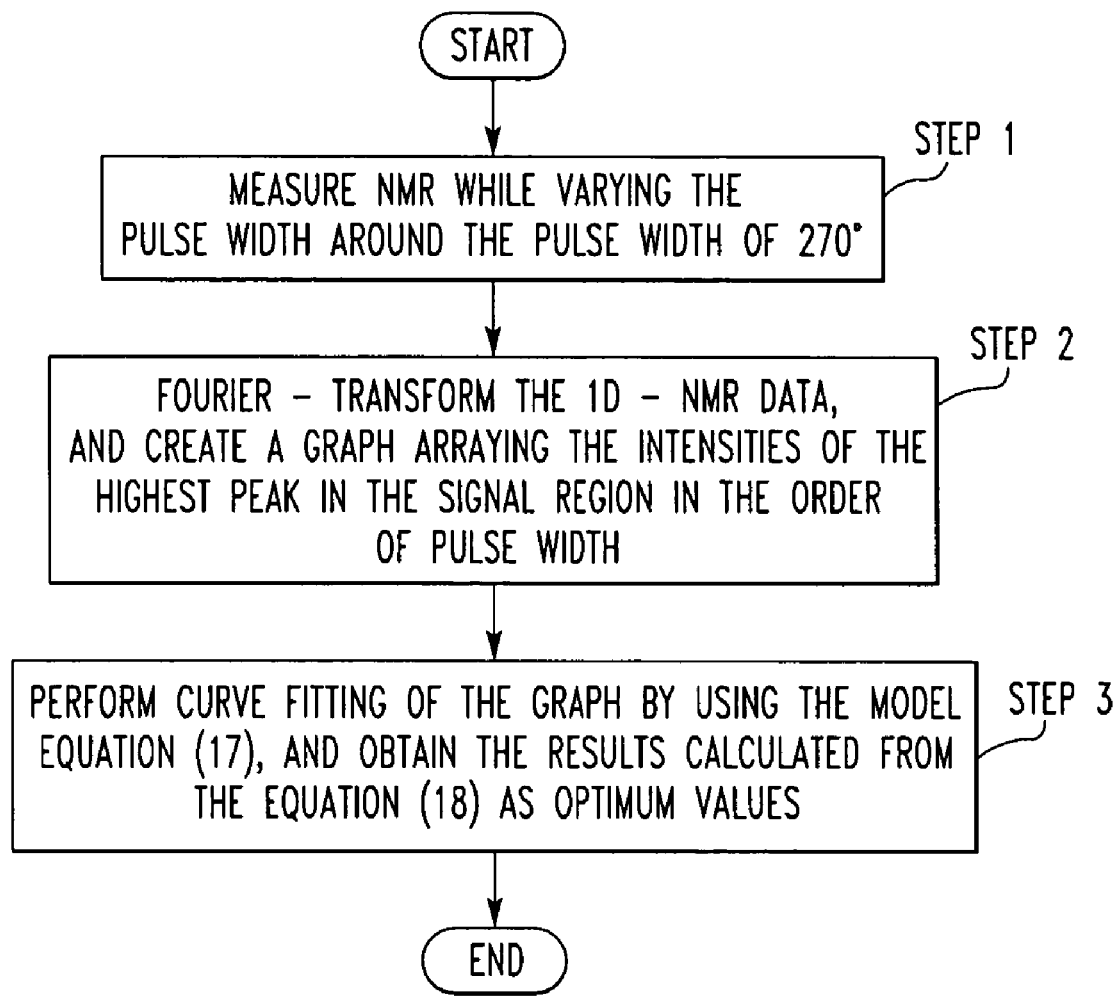
FIG. 31 is a flowchart illustrating Embodiment 10 of the present invention.

Embodiment 10 of the present invention is described by referring to FIG. 31. Embodiment 10 is a method of finding an optimum RF pulse width by performing NMR measurements while varying the RF pulse width in the neighborhood of 270° pulse width and by using the peak top intensities of the signal. In the following description, it is assumed that it is previously known that the 270° pulse width is 21 μs because of the technique described as the prior are or information obtained from another technique.

In step 1, NMR measurements are performed while varying an RF pulse width from 18 to 26 μs (i.e., around 270° pulse width) in increments of 2 μs, using the measurement conditions shown in Table 1 and pulse sequence shown in FIG. 1(c), for example. The measurement data shown in FIG. 20 are obtained.

In step 2, the measurement data are Fourier-transformed, and the top intensities of the maximum peaks in the signal region are plotted along the values of the RF pulse width.

Figure 21:
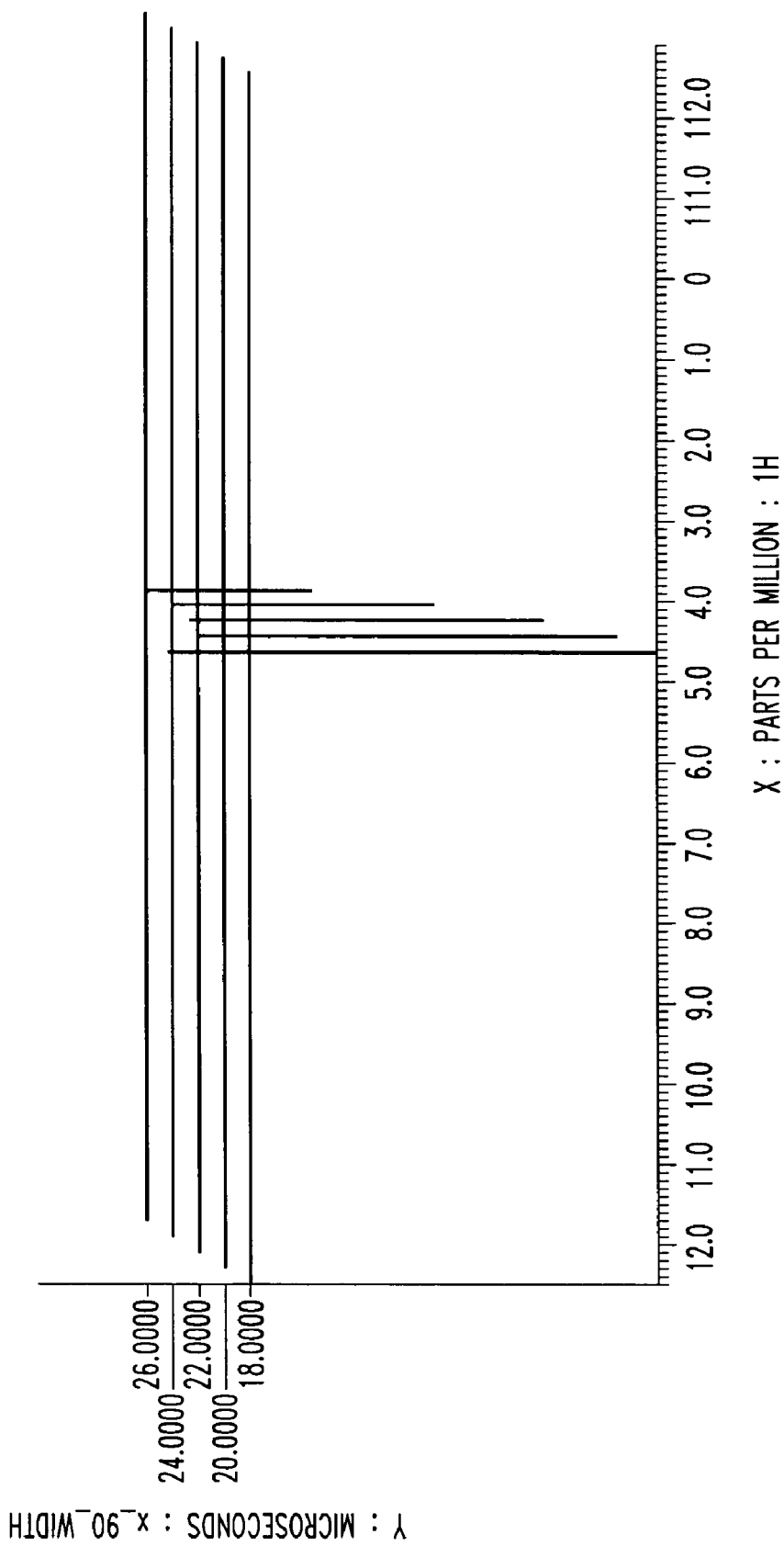
FIG. 21 is a diagram showing data obtained after processing.
Figure 22:
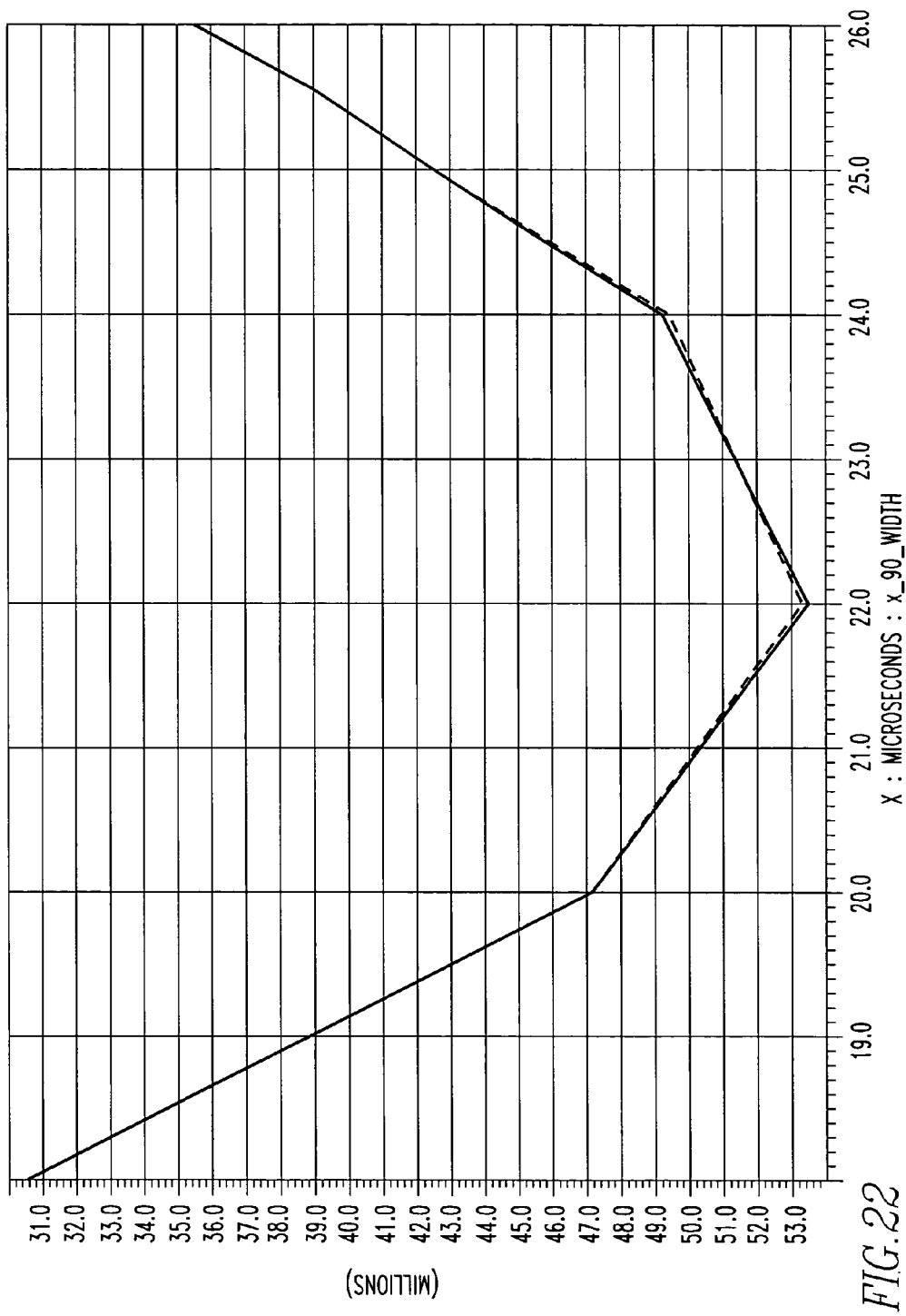
FIG. 22 is a diagram showing a curve obtained by plotting integrated values.
Figure 32:
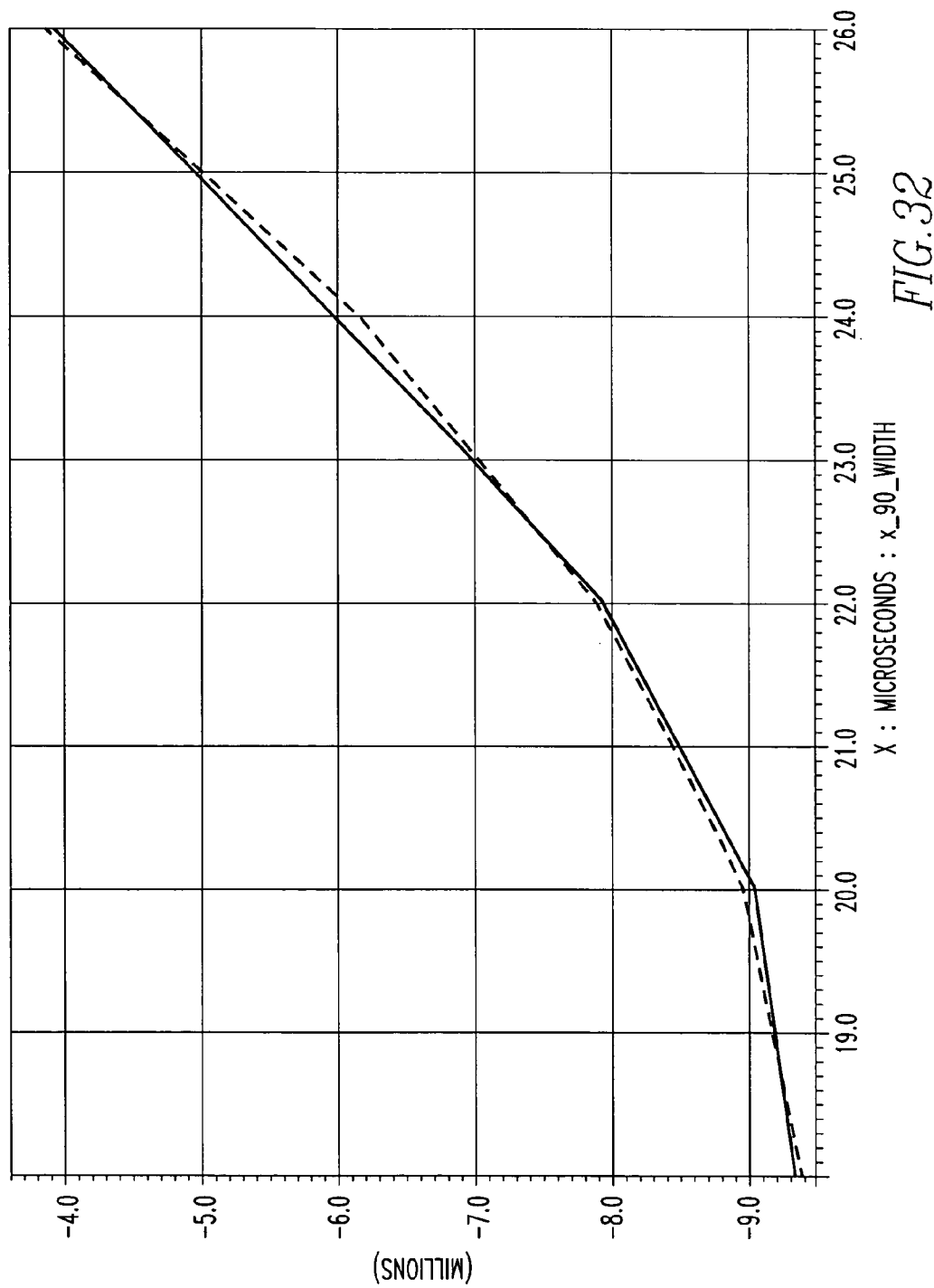
FIG. 32 is a graph showing a curve obtained by plotting peak top intensities.

This processing results in data as shown in FIG. 21. Finding the top intensities of the maximum peaks in a signal existing region from 4 to 5.5 ppm produces results listed in Table 26. Plotting the results gives rise to the curve indicated by the solid line in FIG. 32.

TABLE 26

Results 5 of calculations of peak top intensities

| Index | x_90_width | Intensity |
|---|---|---|
| 1 | 18 μs | −9.34702 Mabn |
| 2 | 20 μs | −9.03598 Mabn |
| 3 | 22 μs | −7.89824 Mabn |
| 4 | 24 μs | −5.96076 Mabn |
| 5 | 26 μs | −3.78569 Mabn |

In step 3, the linear least squares method is implemented using model equation (13). The results shown in Table 27 are obtained. Plotting of the contents of Table 27 using model equation (13) results in the curve indicated by the broken line in FIG. 32.

TABLE 27

Results 10 of calculations of curve fitting

| Constant | Value |
|---|---|
| A | 0.08085 Mabn/μs$^2$ |
| B | −2.84765 Mabn/μs |
| C | 15.66296 Mabn |
| σ | 0.09848 Mabn |

Then, the values in Table 27 are substituted into Eq. (15), producing PW90=5.87 μs as an optimum RF pulse width. The standard deviation σ in Table 27 gives an index of the reliability of the obtained RF pulse width.

In the present embodiment, the step of obtaining the optimum RF pulse width does not use visual estimation. Therefore, reproducible results can be obtained.

Figure 33:
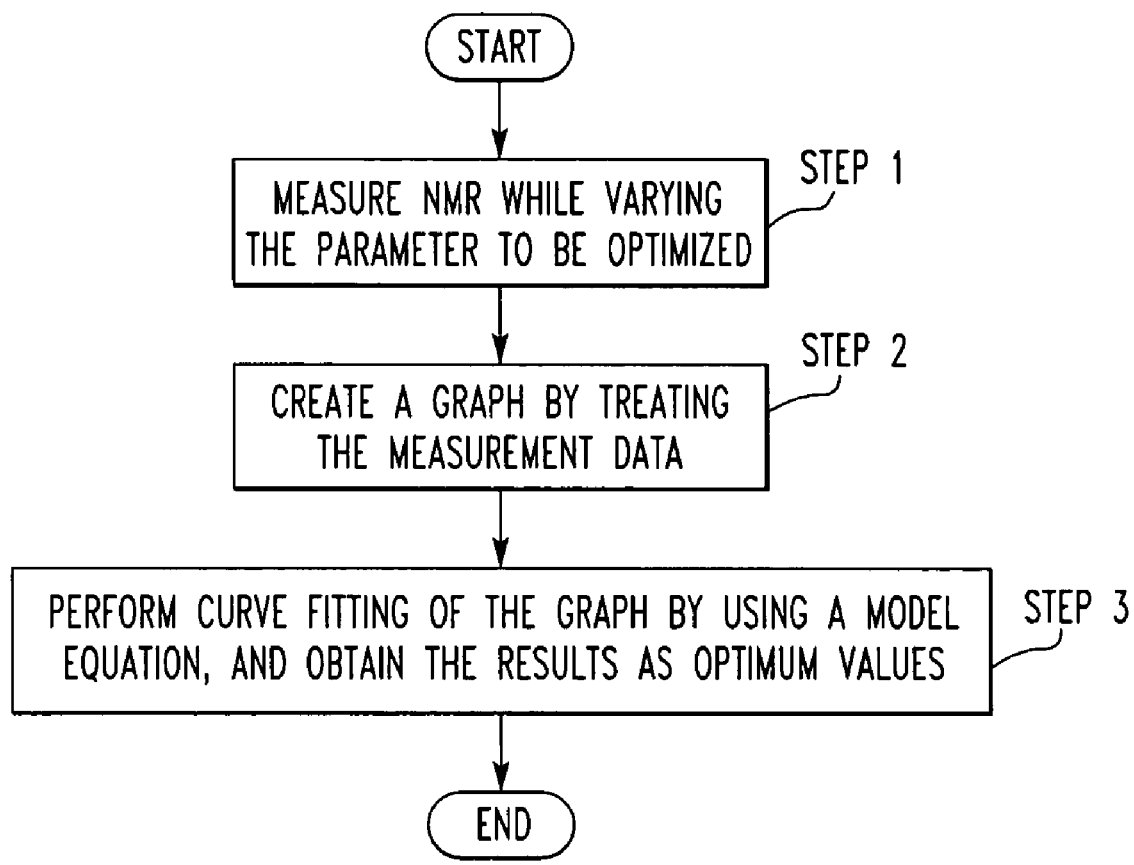
FIG. 33 is a flowchart illustrating Embodiment 11 of the present invention.

Embodiment 11 of the present invention is next described with reference to FIG. 33. Embodiment 11 is a general method of optimizing NMR measurement conditions. Its specific examples are shown in FIGS. 34–36.

In step 1, NMR measurements are performed while varying a measurement condition to be optimized as shown in Table 28, using the measurement conditions shown in Table 1 and pulse sequence shown in FIG. 1(c).

TABLE 28

Candidates for measurement condition

| Name of measurement condition | Definition |
|---|---|
| RF pulse width | Time width of certain RF pulse |
| 40 | Intensity of certain RF pulse |
| | Phase of certain RF pulse |
| RF pulse shape | Shape of certain RF pulse |
| RF offset | Frequency of RF pulse |
| FG pulse width | Time width of certain magnetic field gradient pulse |

TABLE 28-continued

Candidates for measurement condition

| Name of measurement condition | Definition |
| --- | --- |
| FG pulse intensity | Intensity of certain magnetic field gradient pulse |
| FG pulse shape | Shape of certain magnetic field gradient pulse |
| Direction of application of FG pulse | Sense of certain magnetic field gradient pulse in absolute coordinate system |
| Wait time | Wait time between certain pulses |
| Repeat delay | Repetition time |
| Acquisition time | Observation time |
| Scan | Number of repetitions |
| Sweep width | Width of observe frequency |
| Data points | Number of sampling points of observed data |
| Total measurement time | Time from start to end of measurement |
| Lock offset | Frequency of lock signal |
| Angle of axis of rotation of sample | Angle between axis of rotation of sample tube and static magnetic field in measurement of sample being rotated |
| Sample temperature | Temperature of sample under measurement |
| Pressure | Pressure inside sample tube |
| Spin rate | Spin rate of sample tube |
| Volume | Volume of sample |
| pH | pH of sample |
| Concentration | Concentration of sample |
| Position | Position of sample tube |
| Static magnetic field intensity | Intensity of static magnetic field on sample |
| Flow rate | Flow rate of sample through cell in LC-NMR probe |
| Q value | Q value of transmit/receive circuit of probe |
| Shim value | Current value of shim coil |
| Room temperature | Temperature of measuring chamber |
| Coil length | Length of probe coil |
| Filter characteristics | Parameters determining characteristics of digital and analog filters |
| Length of cable | Length of cable used in portions associated with NMR measurement such as NMR spectrometer and probe |
| Thickness of cable | Thickness of cable used in portions associated with NMR measurement such as NMR spectrometer and probe |

In step 2, the measurements data are Fourier-transformed. Then, properties as shown in Table 29 are extracted as numerical values. A curve is created by plotting them along the value varied in step 1.

TABLE 29

Candidates for certain property

| Property of signal | Definition |
| --- | --- |
| Area | Integrated value of signal region |
| Intensity of vertex | Intensity of peak top |
| Position of vertex | Position of peak top |
| Half-height width | Line width at half-peak position |
| Symmetry | Left-and-right symmetry, e.g., area ratio of left and right halves on the opposite sides of a peak top |

In step 3, curve fitting is done by varying constants of a model equation as shown in Table 30 such that the model equation coincident with the parameter varied in step 1, its range, and the property extracted in step 2 agrees with the curve created in step 2. In Table 30, x represents the measurement condition varied on the horizontal axis of the graph, and y represents the horizontal axis of the graph and indicates the value of intensity extracted from measurement results under certain measurement conditions. A, B, C, D, and E are constants, and they are varied such that the standard deviation σ decreases during curve fitting.

TABLE 30

Candidates for model equation

| Model equation | Definition |
| --- | --- |
| $y = Ax + B$ | Used when the graph varies linearly |
| $y = Ax^2 + Bx + C$ | Used when the graph varies quadratically |
| $y = Ax^3 + Bx^2 + Cx + D$ | Used when the graph varies cubically |
| $y = A\sin(Bx + C)\exp(-\frac{x}{D}) + E$ | Used when the graph varies periodically |
| $y = -A\cos(2x + B)\{1 - \cos(2x + B)\}^2 + C$ | Used when the graph varies periodically |

Values of the constants and their standard deviation are obtained by this curve fitting. From these results, an optimum value of a measurement condition as shown in Table 31 is obtained. The standard deviation σ gives an index of the reliability of the obtained optimum value.

TABLE 31

Candidates for optimum value

| Optimum value | Definition |
| --- | --- |
| Maximum x | Value of x when the intensity of graph (value on vertical axis) maximizes |
| Minimum x | Value of x when the intensity of graph (value on vertical axis) minimizes |
| x equal to 0 | Value of x when the intensity of graph (value on vertical axis) approaches closest to 0 |
| Results of calculation of constant value | Value obtained from calculation formula, using an optimum constant value derived as a result of curve fitting as described in Embodiments 1–10 |

In the present embodiment, the step of obtaining an optimum value of a measurement condition does not use visual estimation. Therefore, reproducible results can be obtained.

Figure 34A:
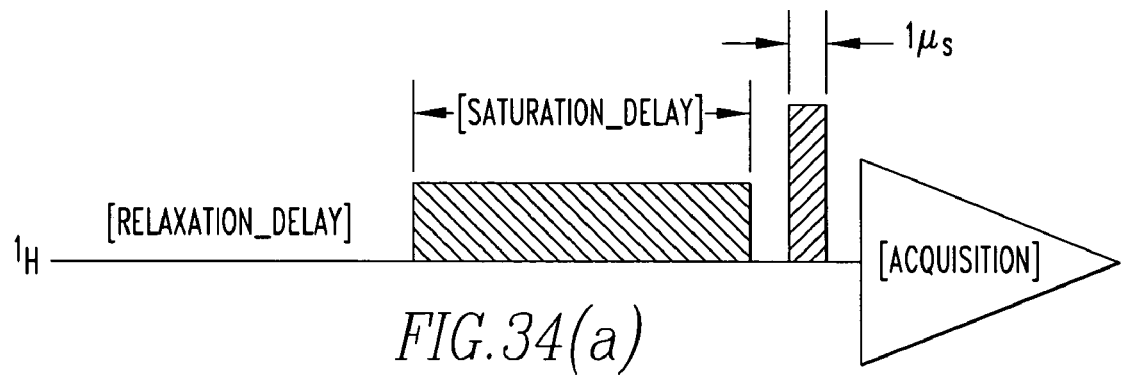
FIGS. 34(a) and 34(b) illustrate a first specific example of Embodiment 11.
Figure 34B:
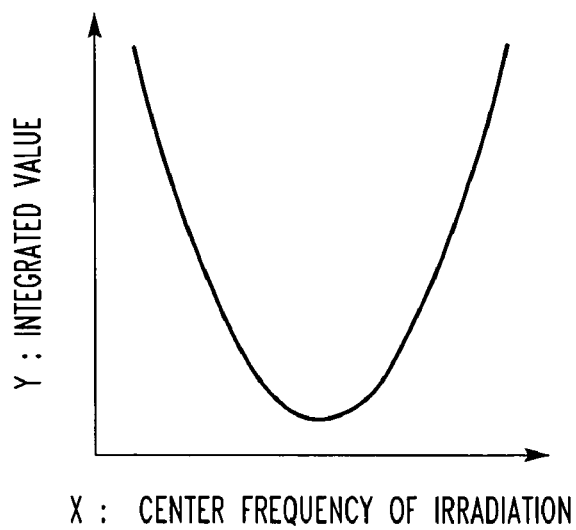

FIGS. 34(a) and 34(b) illustrate a first specific example of Embodiment 11. This first specific example is a method of optimizing the irradiation center frequency in an NMR measurement.

In step 1, NMR measurements are performed using measurement conditions shown in Table 32 and pulse sequence shown in FIG. 34(a), for example. The center frequency of irradiation is varied about the frequency of signal derived from light water. Plural sets of 1D NMR measurement data are obtained.

TABLE 32

Measurement conditions for optimization of center frequency of irradiation

| Item | Value |
| --- | --- |
| Sample | 1 mM albumen lysozyme/90% $H_2O$, 10% $D_2O$ |
| Magnetic field intensity | 14.09636928 T |
| Observed nucleus | $^1H$ |
| Observe frequency | 600.1723046 MHz |
| Observation center frequency | Center frequency of irradiation |
| Number of data points | 16384 |
| Sweep width | 9.00252071 kHz |
| Number of accumulations | 1 |
| Pulse width | 1 μs |
| $B_1$ pulse intensity | 25 kHz |
| Saturation power | 0.25 kHz |
| Saturation delay | 2 s |
| Observation time | 1.81993472 s |
| relaxation_delay | 1 s |
| Temperature | 25° C. |

In step 2, the residual signal derived from light water and indicating the 1D NMR data is Fourier-transformed and integrated values are plotted against the center frequency of irradiation. As a result, a curve as shown in FIG. 34(b) is obtained.

In step 3, the linear least squares method using model equation (16) from which a graph is created is implemented to obtain optimum A, B, and C. Since the optimum center frequency of irradiation is the value of x at the minimum value of the graph of FIG. 34(b), the constants A and B obtained by curve fitting are substituted into Eq. (17), thus obtaining optimum values. In the present specific example, the pulse sequence is not limited to the sequence shown in FIG. 34(a).

$$y = Ax^2 + Bx + C \quad (16)$$

$$\text{optimum value} = -\frac{B}{2A} \quad (17)$$

where x is the center frequency of the irradiation and y indicates the integrated value of the residual signal derived from light water at the center frequency x of irradiation.

FIGS. 35(a) and 35(b) illustrate a second specific example of Embodiment 11. A method of optimizing the wait time δ in $^{15}N$-$^1H$ HSQC is described.

In step 1, 1D NMR measurements are performed using measurement conditions as shown in Table 33 and pulse sequence shown in FIG. 35(a), for example, see *Chemical Physics Letters*, 69, 1980, pp. 185–188, and using varying wait time δ. Thus, plural sets of 1D NMR measurement data are obtained.

TABLE 33

Measurement conditions for optimization of wait time δ in $^{15}N$-$^1H$ HSQC

| Item | Value |
| --- | --- |
| Sample | 1 mM $^{15}N$ labeled ubiquitin/90% $H_2O$, 10% $D_2O$ |
| Magnetic field intensity | 14.09636928 T |
| Observed nucleus | $^1H$ |
| Irradiating nucleus | $^{15}N$ |
| Observe frequency | 600.1723046 MHz |
| Observation center frequency | about 4.7 ppm (resonance frequency of water) |
| Number of data points | 512 |
| Sweep width | 9.00252071 kHz |
| Number of accumulations | 2 |
| Pulse width | 10 μs |
| $^1HB_1$ pulse intensity | 25 kHz |
| $^{15}NB_1$ pulse intensity | 6.25 kHz |
| $^{15}N$ decoupled $B_1$ pulse intensity | 0.78 kHz |
| $t_1$ | 1 μs |
| Observation time | 57 ms |
| relaxation_delay | 1 s |
| Temperature | 25° C. |

In step 2, a certain signal indicating 1D NMR data and derived by Fourier transform is integrated. The integrated value is plotted against wait time δ. As a result, a curve as shown in FIG. 35(b) is obtained.

In step 3, the linear least squares method is implemented using model equation (16) from which a graph is created to obtain optimum A, B, and C. Since the optimum wait time δ is the value of x at the minimum value of the graph of FIG. 35(b), the constants A and B obtained by curve fitting are substituted into Eq. (17), thus obtaining optimum values. In this case, in Eq. (16), x indicates the wait time δ and y indicates the integrated value of signal at the wait time x. Also, in the present specific example, the pulse sequence is not limited to the sequence shown in FIG. 35(a).

FIGS. 36(a) and 36(b) illustrate a third specific example of Embodiment 11. This third example is a method of optimizing magnetic field gradient pulse intensity $Gz_2$ in a $^{15}$N-$^1$H HSQC (heteronuclear single quantum coherence) measurement (hereinafter simply referred to as SE-HSQC) using coherence selection utilizing magnetic field gradient pulses.

In step 1, NMR measurements are performed using measurement conditions as shown in Table 34 and pulse sequence shown in FIG. 36(a), for example, see *Journal of the American Chemical Society*, 114, 1992, pp. 10663–10665, and using varying magnetic field gradient pulse intensity $Gz_2$. Thus, plural sets of 1D NMR measurement data are obtained.

TABLE 34

Measurement conditions for optimization of magnetic field gradient pulse intensity $Gz_2$ in SE-HSQC measurement

| Item | Value |
|---|---|
| Sample | 0.1 mM $^{13}$C labeled methanol 0.1 mM $^{15}$N labeled urea/dimethyl sulfoxide-d6 |
| Magnetic field intensity | 14.09636928 T |
| Observed nucleus | $^1$H |
| Irradiating nucleus | $^{15}$N |
| Observe frequency | 600.1723046 MHz |
| Observation center frequency | about 4.7 ppm (resonance frequency of water) |
| Number of data points | 512 |
| Sweep width | 9.00252071 kHz |
| Number of accumulations | 2 |
| Pulse width | 10 μs |
| $^1$HB$_1$ pulse intensity | 25 kHz |
| $^{15}$NB$_1$ pulse intensity | 6.25 kHz |
| $^{15}$N decoupled B$_1$ pulse intensity | 0.78 kHz |
| Gz$_1$ | 0.25 T/m |
| Observation time | 57 ms |
| relaxation_delay | 1 s |
| Temperature | 25° C. |

In step 2, 1D NMR data are obtained by Fourier transform and an integrated value derived from a certain signal contained in the data is obtained. The integrated value is plotted against $Gz_2$. As a result, a curve as shown in FIG. 36(b) is obtained.

In step 3, the linear least squares method is implemented using model equation (16) from which a graph is created to obtain optimum A, B, and C. Since the optimum magnetic field gradient pulse intensity $Gz_2$ is the value of x at the maximum value of the graph of FIG. 36(b), the constants A and B obtained by curve fitting are substituted into Eq. (17), thus obtaining optimum values. In this case, in Eq. (16), x indicates the $Gz_2$ and y indicates the integrated value of signal at the magnetic field gradient pulse intensity x. Also, in the present specific example, the pulse sequence is not limited to the sequence shown in FIG. 36(a).

As described so far, according to the present invention, the step of obtaining an optimum value of a measurement condition in an NMR measurement does not include visual estimation. Therefore, reproducible results can be obtained. Furthermore, the use of a curve fitting method produces good results even if there are a limited number of data items, as long as they characterize a waveform. Consequently, a reliable optimum value of the measurement condition can be found in a short time.

Having thus described our invention with the detail and particularity required by the Patent Laws, what is desired protected by Letters Patent is set forth in the following claims.

The invention claimed is:

1. A method of optimizing an NMR measurement condition, comprising the steps of:
    gaining NMR measurement data while varying the value of the NMR measurement condition to be optimized;
    extracting a certain property as a numerical value from the measurement data;
    plotting the numerical value of the measurement data versus the varied value of the measurement condition to create a curve;
    setting a model equation coincident with the measurement condition, its range, and the certain property extracted as a numerical value;
    performing curve fitting in which constants of the model equation are varied such that the model equation agrees with the created curve; and
    gaining constant values of the model equation and their standard deviation by curve fitting and obtaining an optimum value of the measurement condition from the gained constant values and standard deviation.

2. A method of optimizing an NMR measurement condition as set forth in claim 1, wherein said measurement condition is an RF pulse width, and wherein said certain property extracted as a numerical value is an integrated value of a region in which a signal obtained by Fourier-transforming measurement data obtained using a given pulse sequence is present.

3. A method of optimizing an NMR measurement condition as set forth in claim 1, wherein said measurement condition is an RF pulse width, and wherein said certain property extracted as a numerical value is a peak top intensity of a region in which a signal obtained by Fourier-transforming measurement data obtained using a given pulse sequence is present.

4. A method of optimizing an NMR measurement condition as set forth in any one of claims 2 and 3, wherein said measurement data are obtained by varying the RF pulse width in the neighborhood of total range of RF pulse width, 360° pulse width, 90° pulse width, 180° pulse width, or 270° pulse width.

5. A method of optimizing an NMR measurement condition as set forth in claim 1, wherein:
    (A) said measurement condition is a center frequency of irradiation,
    (B) said certain property extracted as a numerical value is an integrated value of a signal obtained by Fourier-transforming measurement data obtained using a given pulse sequence, and
    (C) a quadratic function is used as said model equation.

6. A method of optimizing an NMR measurement condition as set forth in claim 1, wherein:
    (A) said measurement condition is a wait time in $^{15}$N-$^1$H HSQC,
    (B) said certain property extracted as a numerical value is an integrated value of a signal obtained by Fourier-transforming measurement data obtained using a given pulse sequence, and
    (C) a quadratic function is used as said model equation.

7. A method of optimizing an NMR measurement condition as set forth in claim 1, wherein:
(A) said measurement condition is a magnetic field gradient pulse intensity in a $^{15}$N-$^1$H HSQC measurement using coherence selection that employs magnetic field gradient pulses,
(B) said certain property extracted as a numerical value is an integrated value of a signal obtained by Fourier-transforming measurement data obtained using a given pulse sequence, and
(C) a quadratic function is used as said model equation.

* * * * *